(12) United States Patent
Kosaka et al.

(10) Patent No.: US 6,426,895 B2
(45) Date of Patent: Jul. 30, 2002

(54) MEMORY SYSTEM AND PROGRAMMING METHOD THEREOF

(75) Inventors: Hideo Kosaka; Akihiko Hashiguchi; Takumi Okaue, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/864,406

(22) Filed: May 25, 2001

(30) Foreign Application Priority Data

Jun. 12, 2000 (JP) ........................................ 2000-180761

(51) Int. Cl.[7] .............................................. G11C 16/04
(52) U.S. Cl. ........................... 365/185.19; 365/185.05; 365/185.12; 365/185.23
(58) Field of Search ..................... 365/185.19, 185.12, 365/185.23, 185.22, 185.05, 185.06, 185.11

(56) References Cited

U.S. PATENT DOCUMENTS 5,883,826 A  * 3/1999 Wendell et al. ............... 365/63
6,147,911 A  * 11/2000 Takeuchi et al. ......... 365/185.28
6,037,785 A1 * 10/2001 Takeuchi et al. ......... 365/185.23

* cited by examiner

Primary Examiner—David Nelms
Assistant Examiner—Gene N. Auduong
(74) Attorney, Agent, or Firm—Ronald P. Kananen, Esq.; Rader, Fishman & Grauer, PLLC

(57) ABSTRACT

A memory system and its programming method capable of reducing the programming time for each page, wherein the memory-cell array is constituted by a MONOS-type (MNOS-type) non-volatile memory or floating gate non-volatile memory in which a source-side channel, hot-electron injection that enables the memory to write therein data by each divided unit (for instance, each 64 bytes=512 bits) is carried out, instead of the write operation where writing is carried out collectively by each page unit (512 bytes). Further, there is provided an emulation circuit successively storing programming data that constitute the page of a plurality of divided units and a control circuit successively reading the held divided unit data so as to write to the non-volatile memory.

12 Claims, 21 Drawing Sheets

CAM ELECTRIC CHARGE ACCUMULATED LAYER

FIG. 14

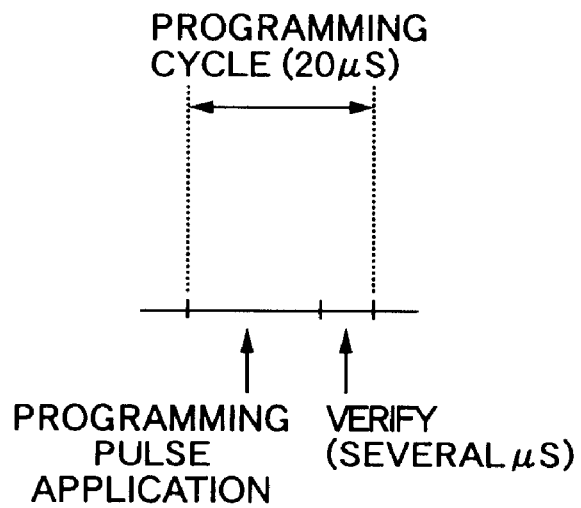

PROGRAMMING CYCLE (20μS)

PROGRAMMING PULSE APPLICATION

VERIFY (SEVERAL μS)

FIG. 15

| (NUMBER OF TIMES) | (BIT UNIT) |
|---|---|
| PROGRAMMING PULSE 8 TIMES | 1 PAGE |
| VERIFY 8 TIMES | 1 PAGE |
| PROGRAMMING PULSE 8 TIMES | 1 PAGE |
| VERIFY 8 TIMES | 1 PAGE |
| PROGRAMMING PULSE 8 TIMES | 1 PAGE |
| VERIFY 8 TIMES | 1 PAGE |
| PROGRAMMING PULSE 8 TIMES | 1 PAGE |
| VERIFY 8 TIMES | 1 PAGE |

TOTAL PROGRAMMING PULSE 32 TIMES
VERIFY 32 TIMES

PROGRAMMING TIME FOR 1 PAGE : 640 μS

FIG. 16

| | (NUMBER OF TIMES) | (BIT UNIT) |
|---|---|---|
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |
| | PROGRAMMING PULSE 1 TIME | 512 BITS |
| | VERIFY 1 TIME | 512 BITS |

TOTAL PROGRAMMING PULSE 16 TIMES
VERIFY 16 TIMES
PROGRAMMING TIME OF 1 PAGE : 320 $\mu$S

FIG. 18

| (NUMBER OF TIMES) | (BIT UNIT) | (NUMBER OF CHIP) |
|---|---|---|
| PROGRAMMING PULSE 1 TIME | 1 PAGE | 8 CHIPS |
| VERIFY 1 TIME | 1 PAGE | 8 CHIPS |
| PROGRAMMING PULSE 1 TIME | 1 PAGE | 8 CHIPS |
| VERIFY 1 TIME | 1 PAGE | 8 CHIPS |
| PROGRAMMING PULSE 1 TIME | 1 PAGE | 8 CHIPS |
| VERIFY 1 TIME | 1 PAGE | 8 CHIPS |
| PROGRAMMING PULSE 1 TIME | 1 PAGE | 8 CHIPS |
| VERIFY 1 TIME | 1 PAGE | 8 CHIPS |

TOTAL PROGRAMMING PULSE 4 TIMES
VERIFY 4 TIMES
PROGRAMMING TIME OF ONE PAGE : 80 $\mu$S

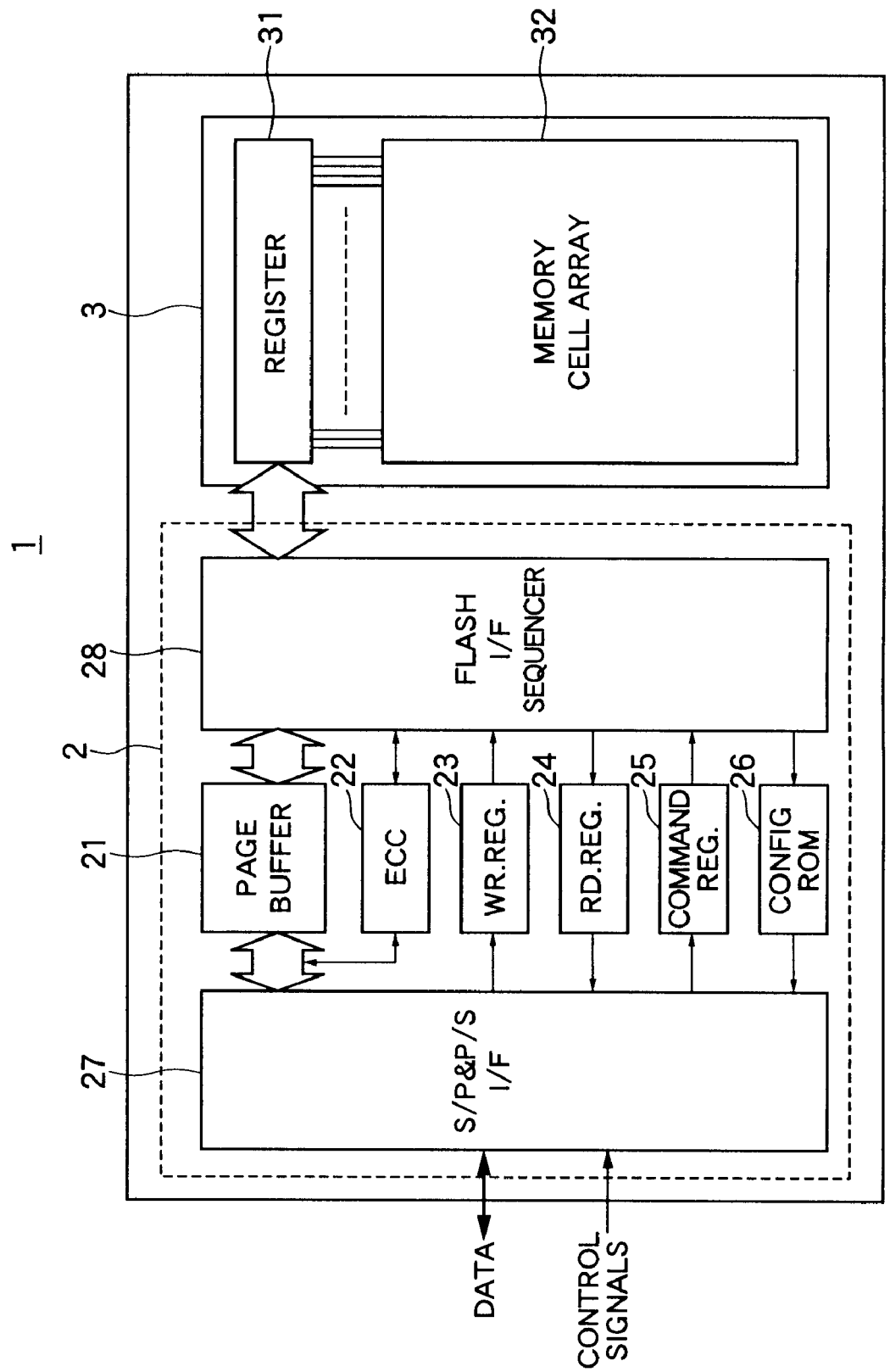

FIG. 22A SERIAL TRANSFER
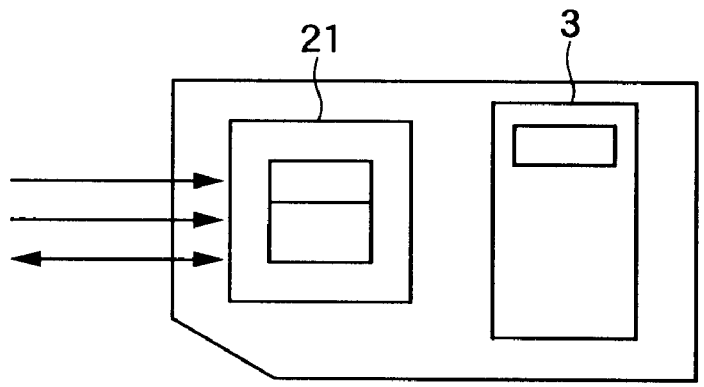
FIG. 22B INTERNAL TRANSFER
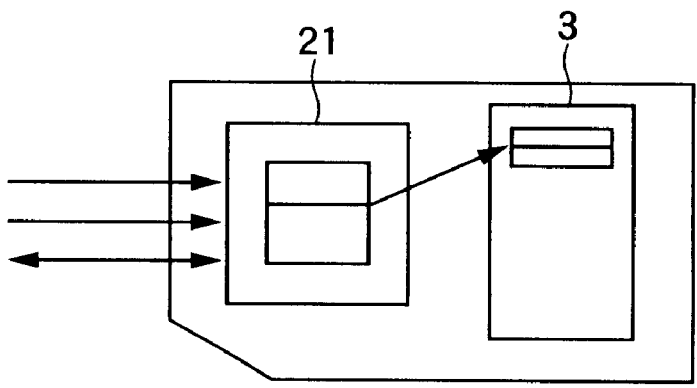
FIG. 22C PROGRAMMING
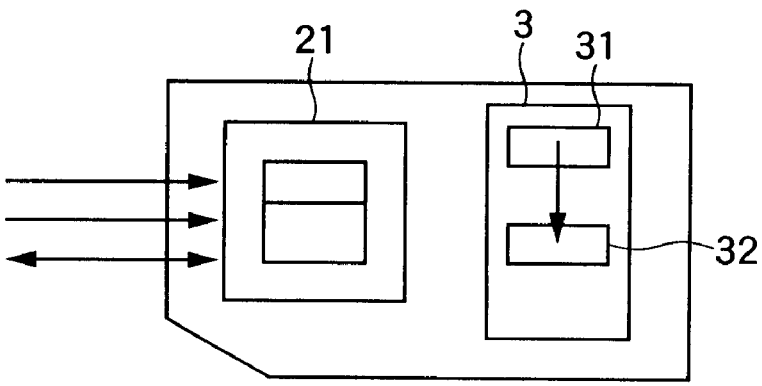

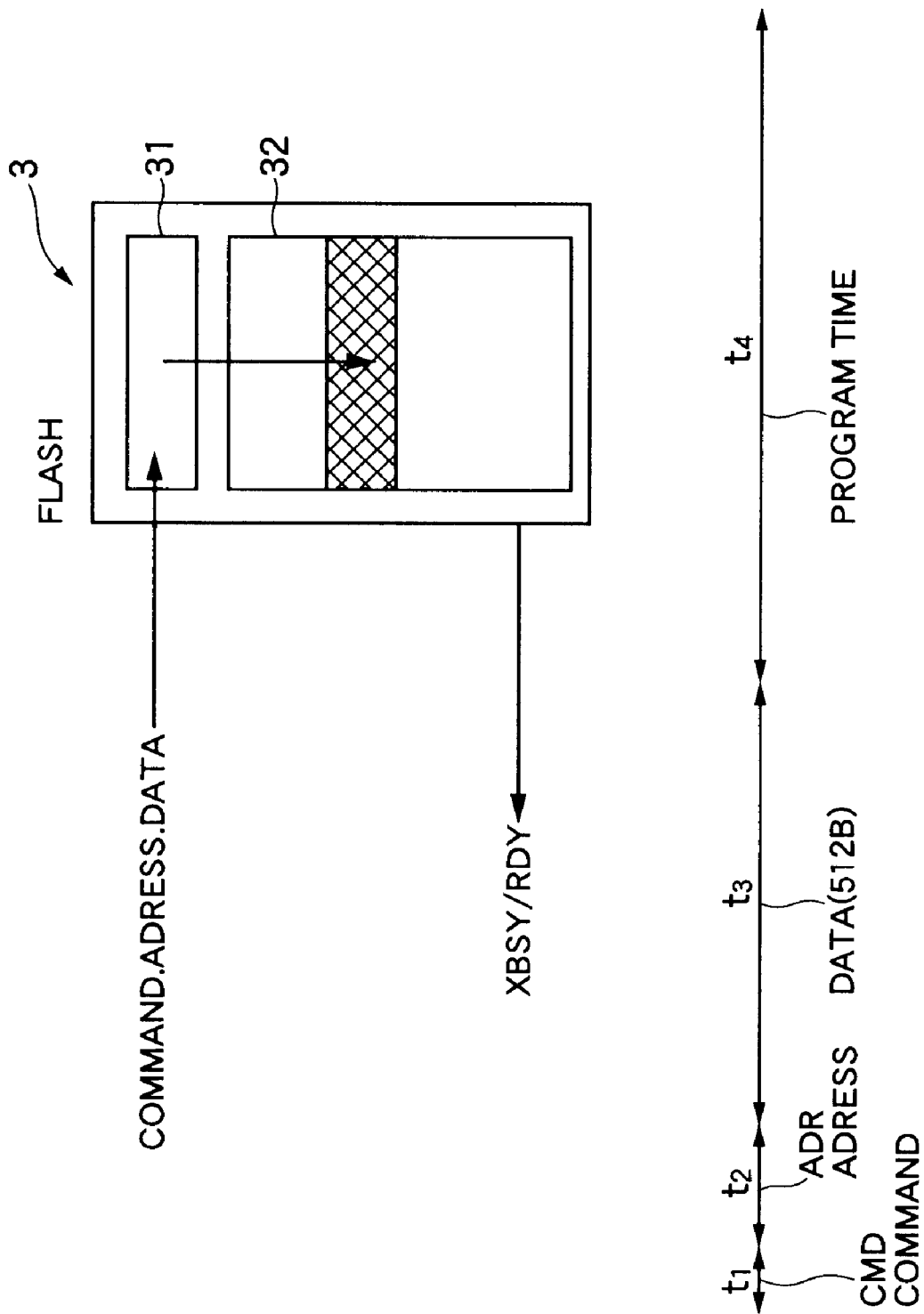

US 6,426,895 B2

MEMORY SYSTEM AND PROGRAMMING METHOD THEREOF

BACKGROUND OF THE INVENTION

1. Field of the Invention

The present invention relates to a memory system and its programming method using a non-volatile memory in which writing is carried out by every page unit.

2. Description of the Related Art

FIG. 21 is a block diagram illustrating a configuration example of a conventional memory system using an NAND-type flash memory array.

This memory system 1 has a control portion 2 and a memory portion 3, as a main configuration component.

The control portion 2 has a page buffer 21, an error correction circuit (ECC) 22, a write register (WR.Reg) 23, a read register (RD.Reg.) 24, a command register (Command Reg.) 25, a configuration ROM (Config ROM) 26, an external interface 27 for performing serial (S)/parallel (P) conversion of write data from the external portion and for performing parallel (P)/serial (S) conversion of read data from the memory portion 3 to output to the external portion, ana a memory interface 28.

Further, the memory portion 3 has a memory-cell array 32 in which an NAND-type flash memory array is arranged, a register 31 and a control circuit that is not illustrated.

Note, the data register 31 is constituted by a command register, a data register and other register(s).

The programming (write) operation of this memory system will be explained.

Conventionally, in a non-volatile memory, such as an NAND-type flash memory, since the programming (write) speed of a memory itself is slow, for instance, as illustrated in FIG. 22A, the page buffer 21 stores therein data once.

Next, as illustrated in FIG. 22B, data is transferred by means of internal transfer from the page buffer 21 to the register 31 of the memory portion 3.

Finally, as illustrated in FIG. 22C, the process is made to execute collectively the programming of data for one page (for instance, data for 512 bytes connected 1 word line), namely, the programming of the memory-cell array for one-page data from the register 31 is executed.

FIG. 23 is a schematic view illustrating program timing of the NAND-type flash memory.

In the programming of the NAND-type flash memory, as illustrated in FIG. 23, a command (CMD) is input to the register 31 in the period t1, the input is made to execute an address (ADR) that is input to the register 31 in the subsequent period t2, and the data for one page of 512 bytes is input to the register 31 in the further subsequent period t3.

Then, writing is made to execute collectively data for one page of 512 bytes input in the period t4 in accordance with the input command and address.

As described above, in the conventional memory system, since a NAND-type flash memory that is capable of carrying out collectively writing for each page is employed and writing is made to execute collectively one page for data to be programmed by each page, the total programming time required for input of command, address and data, further actual programming is long (maximum writing time of one page is up to about 1500 $\mu$s), and thus it may be difficult to apply to such the NAND-type flash memory to a memory system, such as a memory card, which requires high-speed operation.

SUMMARY OF THE INVENTION

An object of the present invention is to provide a memory system and a programming method capable of shortening the programming time for each page and applicable in a variety of systems.

In order to achieve the above-mentioned object, according to a first aspect of the present invention, there is provided a memory system in which a program is completed with a page as a unit comprising: an intermediate circuit successively holding program data that form the page in a division unit where the program data is divided into a plurality of division units; a memory-cell array in which a plurality of memory cells, each including at least one memory transistor having a control gate controlling a charge accumulating means and a charge quantity accumulated in the charge accumulating means, in which at least one selection transistor having a shared channel formation region and the memory transistor are arranged, and in which the plurality of memory cells arranged in the direction of a word line are connected in a cascade connection; word lines to which gates of the selection transistors of each memory cell cascade-connected in the direction of the word line are commonly connected; and a control circuit successively reading the divided unit data held in the intermediate circuit when programming, electrically dividing the memory-cell array in every interval of a plurality of the memory cells in response to the division unit in the direction of the word line by driving the control gate of the memory transistor, and writing the division unit data to the memory-cell array by parallel applying programming pulses to the control gates of the memory transistors in a predetermined bit unit.

In accordance with a second aspect of the present invention, there is provided a memory system in which a program is completed with a page as a unit comprising: a plurality of divided circuits each having an intermediate circuit successively holding programming data that form a page(s) in a division unit where the program data is divided into a plurality of division units, a memory-cell array in which a plurality of memory cells, including at least one memory transistor having a control gate controlling a charge accumulating means and a charge quantity accumulated in the charge accumulating means, in which at least one selection transistor having a shared channel formation region and the memory transistor are arranged, and in which the plurality of memory cells arranged in the direction of a word line are connected in cascade connection; word lines to which a gate of the selection transistor of each memory cell cascade-connected in the direction of the word line are connected commonly; and a control circuit constituting pages in such a way as to range over a plurality of divided circuits, successively reading divided unit data held in the intermediate circuit when programming, electrically dividing the memory-cell array at intervals of a plurality of the memory cells corresponding to the divided unit in the direction of the word line by driving the control gate of the memory transistor of each divided circuit, and writing the divided unit data to the memory-cell array by applying programming pulses in parallel to the control gate of the memory transistor in a predetermined bit unit with ranging over the plurality of divided circuits.

The control circuit may carry out an application of the programming pulse application in parallel, and it continuously carries out the verification in all the same bit unit.

The charge accumulating means of the memory cell may include an insulating film that includes a nitride film.

The memory cell may include a first memory transistor, a second memory transistor and a selection transistor formed to have a common channel formation region between the first memory transistor and second memory transistor, the charge accumulating means of both the memory transistor and second memory transistor is included in the insulating film that includes the nitride film, and the first memory transistor of one memory cell and the second memory transistor of the memory cell adjacent to the one memory cell commonly have an insulating film as the control gate and the charge accumulating means.

In accordance with a third aspect of the present invention, there is provided a programming method for a memory system having a memory-cell array in which a plurality of memory cells, each including at least one memory transistor having a control gate controlling a charge accumulating means in which a charge quantity accumulated in the charge accumulating means, and at least one selection transistor having a shared channel formation region and the memory transistor are arranged, in which a plurality of memory cells arranged in the direction of a word line are connected in a cascade connection, and in which programming is completed with a page as a unit, and comprising the steps of: successively holding programming data that forms a page in a division unit where the program data is divided into a plurality of division units; successively reading the held divided unit data; electrically dividing the memory-cell array in every interval of a plurality of memory cells corresponding to the divided unit in the direction of the word line by driving the control gate of the memory transistor; and successively writing the divided unit data to the memory-cell array by carrying out parallel programming pulse application to the control gate of the memory transistor in a predetermined bit unit.

According to a fourth aspect of the present invention, there is provided a programming method for a memory system having a plurality of divided circuits, each including a memory-cell array in which a plurality of memory cells, including at least one memory transistor having a control gate controlling a charge accumulating means and a charge quantity accumulated in the charge accumulating means, in which at least one selection transistor having a shared channel formation region and memory transistor are arranged, in which a plurality of memory cells arranged in the direction of a word line are connected in a cascade connection, and in which a programming is completed with a page as a unit, and comprising the steps of: successively holding programming data that constitutes a page in a division unit, where the program data is divided into a plurality of division units; forming the page in such a way as to range over a plurality of divided circuits; successively reading the held divided unit data; electrically dividing the memory-cell array in every interval of a plurality of memory cells corresponding to the divided unit in the direction of the word line while driving the control gate of the memory transistor of each the divided circuit; and successively writing the divided unit data to the memory-cell array by carrying out a parallel programming pulse application to the control gate of the memory transistor in a predetermined bit unit ranging over the plurality of divided circuits.

In the present invention, the program data with a page as a unit are held successively with the plurality of divided units that constitute a page of the programming data. Then, a simultaneous programming pulse application is made to carry out, for instance, against the bit units existing in every interval of several bits on the word line, followed by carrying out verification of the same bit units continuously; thus, writing is carried out in every divided unit data.

Also, in the present invention, a page is constituted in such a way as to range over a plurality of divided circuits, for instance, in such a way as to range over a plurality of chips or a plurality of mats; then, for instance, a simultaneous programming pulse application is made to carry out against the bit units existing in every interval of several bits on the word line with ranging over a plurality of chips or a plurality of mats, followed by carrying out verification of the same bit units continuously; thus, writing is carried out in every divided unit data.

BRIEF DESCRIPTION OF THE DRAWINGS

These and other objects and features of the present invention will become clearer from the following description of the preferred embodiments given with reference to the accompanying drawings, in which:

FIG. 14 is a view illustrating a configuration example of the programming cycle;

FIG. 15 is a view illustrating the number of programming pulse applications of one page according to a first programming method;

FIG. 16 is a view illustrating the number of programming pulse applications of one page according to a second programming method;

FIG. 18 is a view illustrating the number of programming pulse applications of one page according to a third programming method;

FIG. 21 is a block diagram illustrating a configuration example of the conventional memory system;

FIGS. 22A to 22C are views explaining about the programming (write) operation of the conventional memory system; and FIG. 23 is an explaining view about the programming time of the conventional memory system

DESCRIPTION OF THE PREFERRED EMBODIMENTS

Below, preferred embodiments of the present invention will be described with reference to the accompanying drawings.

Figure 1:
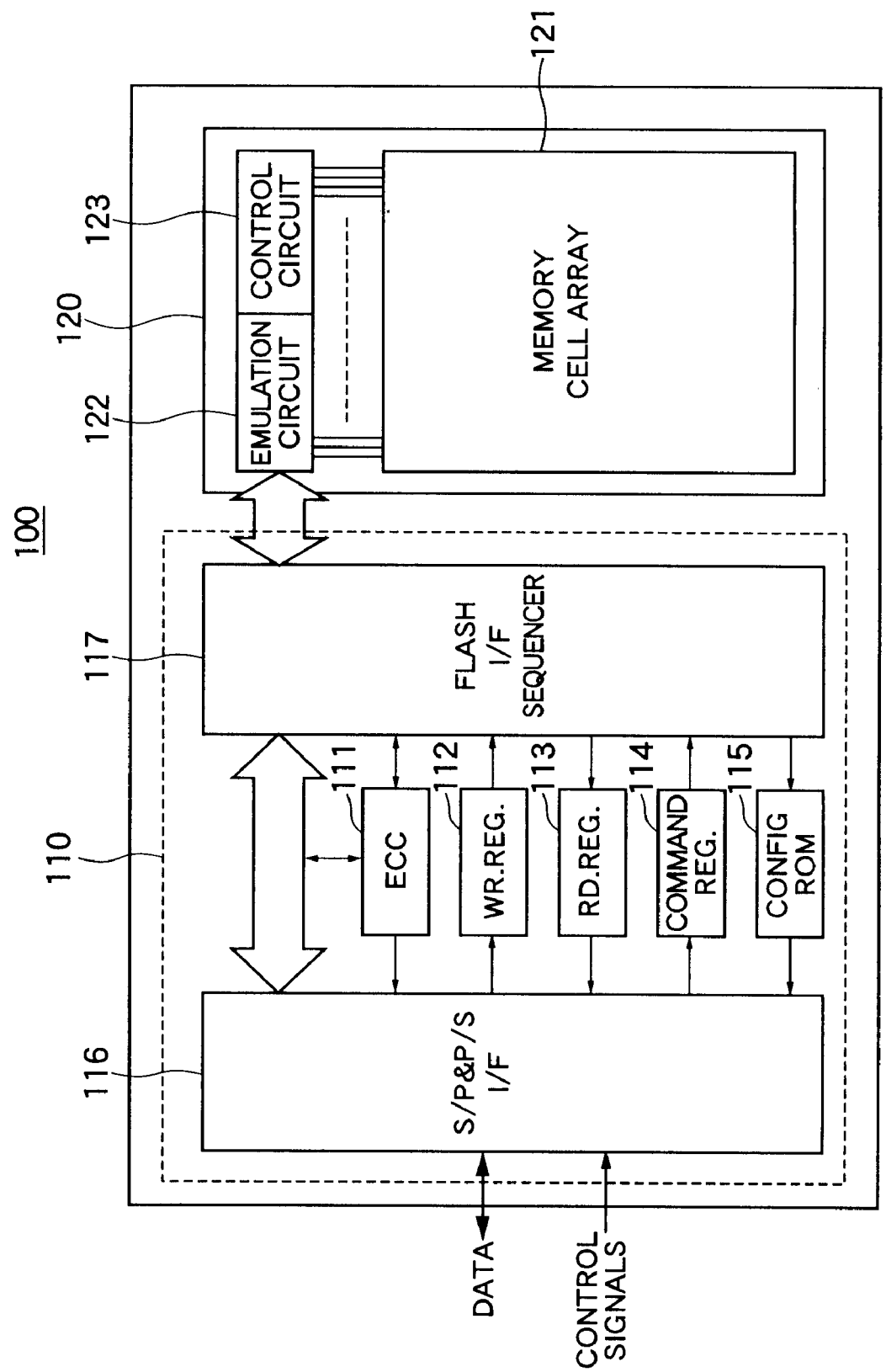
FIG. 1 is a block configuration view illustrating one embodiment of a memory system according to the present invention.

FIG. 1 is a block configuration view illustrating a first embodiment of a memory system according to the present invention.

This memory system 100 has a control portion 110 and a memory portion 120 as main configuration components.

The control portion 110 has an error correction circuit (ECC) 111, a write register (WR.Reg) 112, a read register (RD. Reg.) 113, a command register (Command Reg.) 114, a configuration ROM (Config ROM) 115, an external interface 116 for performing serial(S)/parallel (P) conversion of write data from the external portion and for performing parallel(P)/serial(S) conversion of read data from the memory portion 120 to output to the external portion, and a memory interface 117.

Further, the memory portion 120 has a memory-cell array 121 in which non-volatile memory cells are arranged, an intermediate circuit (emulation circuit) 122 and a control circuit 123 as main components.

This memory system 100 is different from the conventional memory system explained with reference to FIG. 21 in that the memory-cell array is configured by a non-volatile memory capable of writing therein data by each divided unit (for instance, each 64 bytes=512 bits) other than collectively writing by each page (512 bytes), the program data which constitutes each page are successively held in a division unit dividing a plurality of program data, and the held division unit data are successively read and stored. As a result, the circuit configuration of the present memory system is different from the conventional circuit in that the control portion 11 is not provided with a page buffer, and the concrete circuit configuration of the memory portion 120 is different therefrom.

The concrete circuit configuration of the memory portion 120 and the programming method according to the present embodiment of the present invention will be described in detail bellow with reference to the accompanying drawings.

Figure 2:
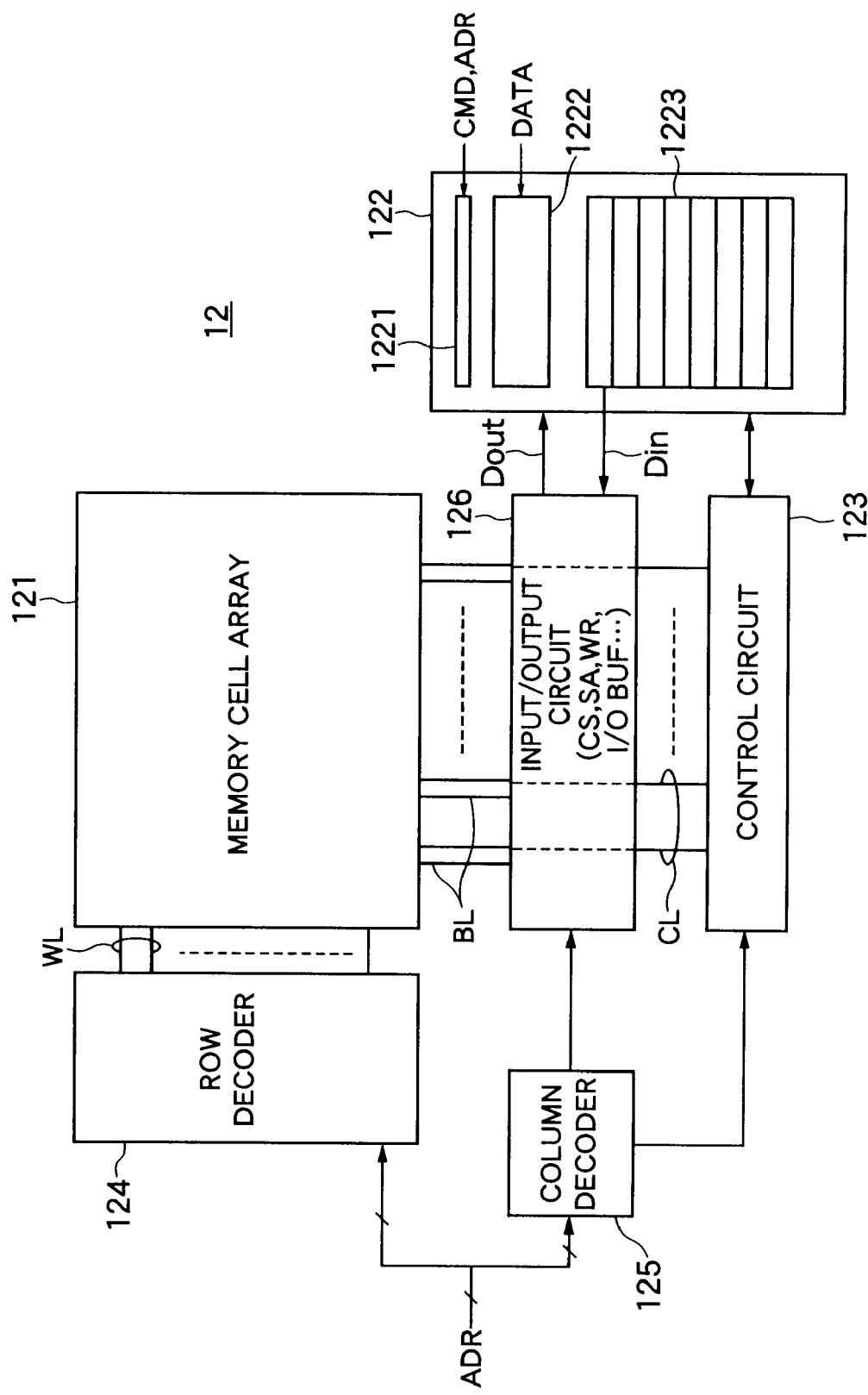
FIG. 2 is a block diagram illustrating the configuration of a main part of the memory portion according to the embodiment of the present invention.

FIG. 2 is a block diagram illustrating a main configuration of the memory portion 120 according to the embodiment of the present invention.

This memory portion 120 has a row decoder 124, a column decoder 125 and an input/output circuit 126, in addition to the aforementioned memory-cell array 121, the emulation circuit 122 and control circuit 123.

In FIG. 2, circuits for switching the operating mode responsive to the reception of enable signals of read, write or erase, circuits for controlling the operating timing on the basis of clock, power-supply circuit, address buffer, and other circuit are not illustrated.

Note, the input/output circuit in FIG. 2 includes all the circuits of the bit line side necessary for write or read, such as a column selection circuit Cs, a sense amplifier SA, a write circuit WR, and an input/output buffer I/OBUF.

The emulation circuit 122 has a register 1221 for, for example, command CMD and address ADR, and data registers 1222 and 1223. When programming, in the emulation circuit 122, register 1221 stores the command CMD and the address ADR, register 1221 stores divided unit data (for example, 64 bytes=512 bits) and register 1223 stores collectively the division data. These registers inform the control circuit 123 of the storage, and output of the data stored in the registers to the input/output circuit 126 is carried out under the control of the control circuit 123.

The control circuit 123, as described later, drives the control gate of the memory transistor of the memory-cell array 121, electrically divides the memory-cell array in the direction of the word line in each plurality of memory cells corresponding to the aforementioned divided unit in a parallel application of programming pulses to the control gate of the memory transistor in the predetermined bit unit, and successively writes the divided unit data read out on the input/output circuit 126 to the memory-cell array. At this time, the control circuit 123 carries out the parallel programming pulse application and the verification of the same bit unit continuously.

The row decoder 124 receives the address signal ADR, selects all or any one of a plurality of the word lines WL arranged in the memory-cell array 121 in response to the received address signal ADR, and changes voltages of the selected word lines WL corresponding to read, write or erase to activate the same.

The column decoder 125 receives the address signal ADR, controls a column selection circuit CS in the input/output circuit 126 in response to the received address signal ADR, and selects a plurality of the bit lines BL arranged in the memory-cell array 121, for instance, in every predetermined number of the bit lines.

The column selection circuit CS connects all of the selected bit lines to the sense amplifiers SA when reading, and connects all of the selected bit lines to the write circuit WR when writing.

When reading, the data stored in the memory cell are detected from the selected bit line BL by the sense amplifier SA through the column selection circuit CS. The detected result is accumulated at a predetermined address in the input/output buffer I/OBUF.

As described later, the reason for the data accumulation is that the collectively read data in the present embodiment are arranged discretely in every predetermined bit. When all one line storage data become complete by a plural number of reads, the data are output to an external data bus or the like as read data $D_{out}$, for instance, in a predetermined word unit.

Or, the discretely read data may not be buffered to handle one line storage data itself and are output to the external data bus or the like.

Further, when programming, the divided unit data $D_{in}$ from the emulation circuit 122 is accumulated once in the input/output buffer I/OBUF. Then, a write of one line data is made to execute into the memory cell while converting the bit line voltage into the threshold voltage of the memory transistor due to plural numbers of the write operation, with a plurality of the bit lines BL discretely selected by the column selection circuit as a unit.

Or, when the divided unit data $D_{in}$ is sent as discrete writing one line storage data, it is suitable to successively write it in the memory-cell array without buffering the input data.

As described later in detail, in the memory-cell array 121 according to the present embodiment, there are provided the control gate line CL and the bit line BL that make a pair as common lines in the direction of the bit line. The control line CL is in one case where one control line CL and one bit line BL exist, while in the other case where two control lines CL and one bit line BL exist.

These control lines CL are connected to the control circuit 123.

The control circuit 123 receives a control signal decoded at the column decoder 125, followed by dividing memory cell line connected to one word line electrically in accordance with the rule established beforehand, further changing the divided portion.

Concretely, the voltage of the control gate line CL that is to be the divided portion is made to switch from an initial voltage to an interrupting voltage; and, when removing the divided portion, the voltage of the control gate line CL that is to be the divided portion is made to switch from the interrupting voltage to the initial voltage.

An example of the construction of the memory-cell array 121 will be explained with reference to FIG. 3 to FIG. 8 below. Then programming operation according to the present embodiment will be explained in detail.

One memory cell according to the present embodiment has a configuration in which a selection transistor ST is arranged between two memory transistors MT1, MT2 having a charge accumulated layer CAM. In structure, a selection gate (word line W1 in the drawing) is arranged at the center portion between source-drain regions of the one memory cell, and the charge accumulated layer CAM in which the charge accumulated quantity is controlled according to a voltage applied to the control gate CG is arranged at the both sides of the selection gate.

Further, in the memory-cell array 121 according to the present embodiment, the selection gate of the selection transistor ST of respective memory cells MCij is connected to the word line WL, both the source and drain regions are connected to the bit line BL, and the control gate line CL for controlling the charge accumulated layer has an array structure arranged in parallel to the bit line BL.

Further, in the present embodiment, a storage data in one charge accumulated layer CAM is assumed as 1 bit. In the memory cell according to the present embodiment, since one selection gate stands opposite to two bits, the memory cell size per bit is small.

Furthermore, the control gate CG and the word line WL are formed of polysilicon or the like. The bit line BL is formed by an n$^+$diffusion layer.

The memory-cell array 121 according to the present embodiment can adopt two kinds of array construction, i.e., one is constituted in such a way as to separate the control gate from that of the memory cell adjacent thereto in the direction of the word line; while the other is constituted in such a way as to hold the control gate in common with that of the memory cell is adjacent thereto in the direction of the word line. Concretely, the memory-cell array 121 can adopt two kinds of array construction for the control gate—the separated type and the control gate shared type.

Figure 3:
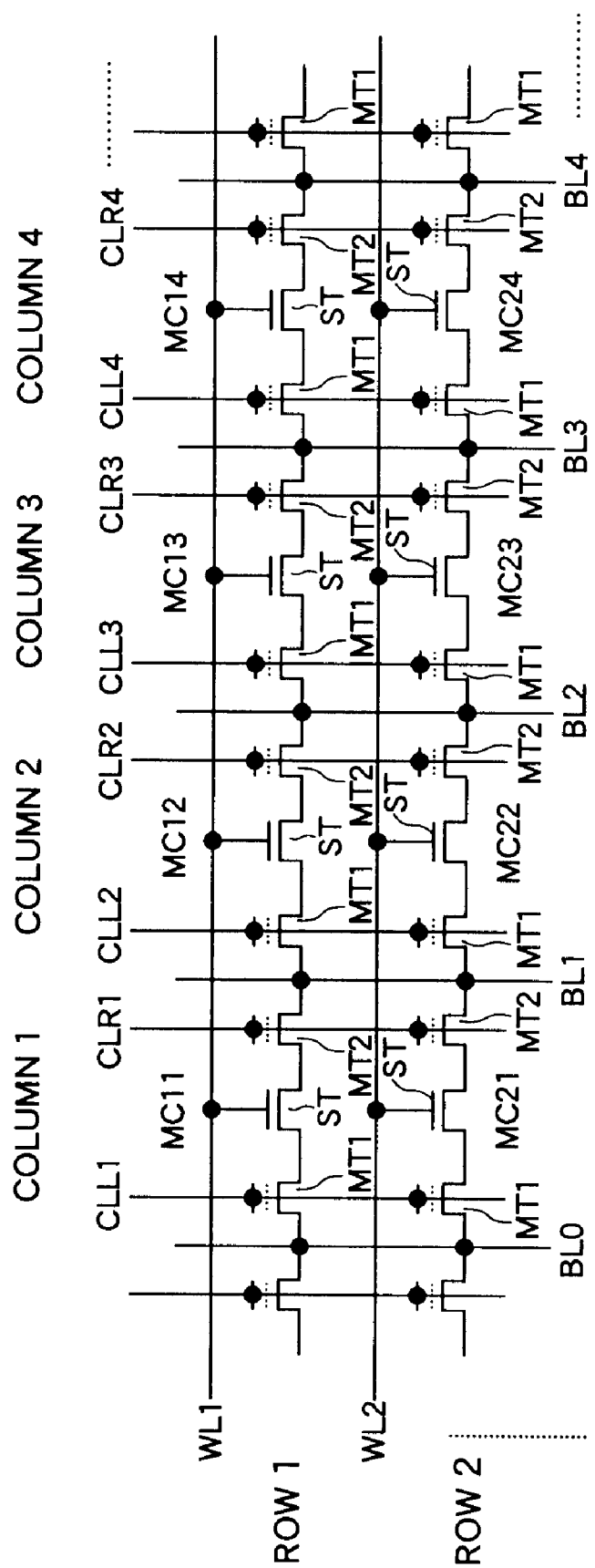
FIG. 3 is an equivalent circuit view illustrating the control gate separation type memory-cell array according to the present embodiment.
Figure 4:
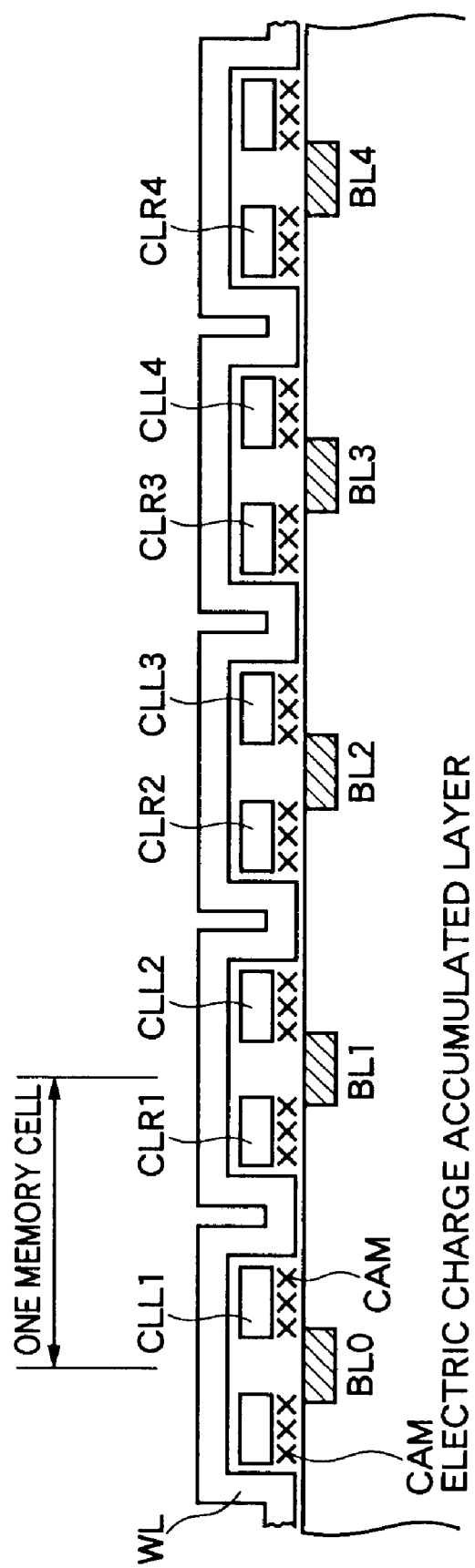
FIG. 4 is a schematic portional view along the direction of a word line of the control gate separation type memory-cell array according to the present embodiment.
Figure 5:
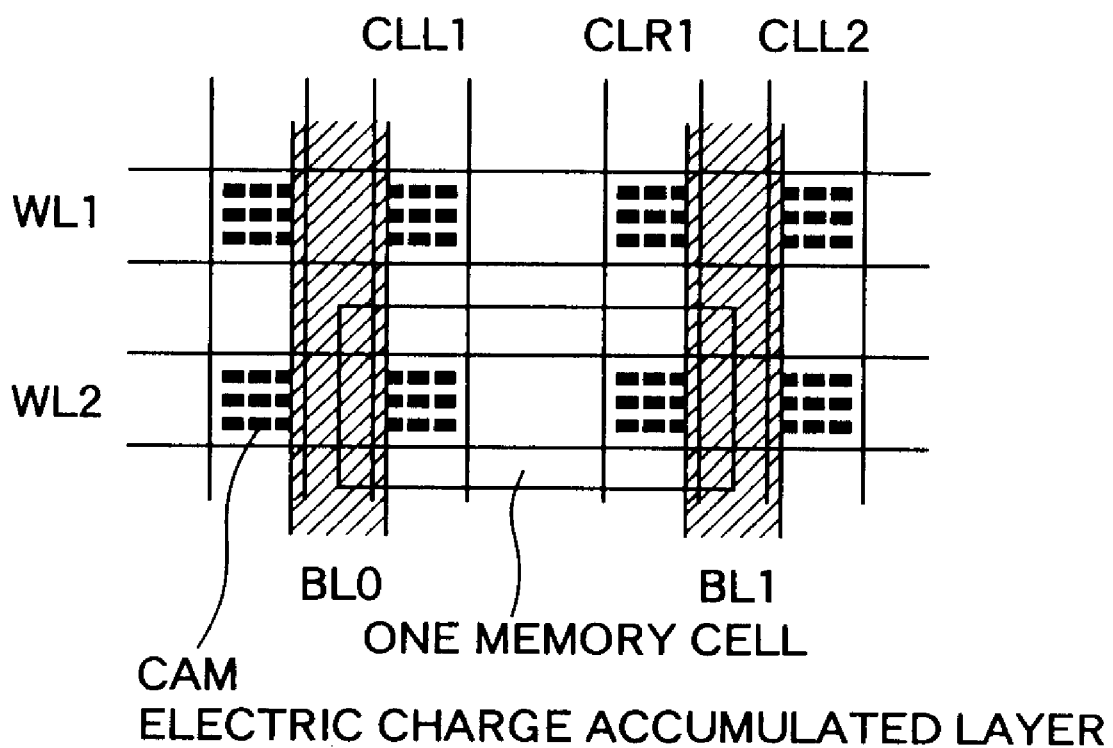
FIG. 5 is a plan view of a part (one row of FIG. 2) of the control gate separation type memory-cell array according to the present embodiment.

The control gate separation memory-cell array is illustrated in FIG. 3 to FIG. 5.

FIG. 3 is an equivalent circuit view illustrating the control gate separation memory-cell array. FIG. 4 is a schematic portional view in the direction of the word line of the control gate separation memory-cell array. FIG. 5 is a plan view of a part (1 column of FIG. 3) of the control gate separation memory-cell array.

In the control gate separation memory-cell array 121A, as illustrated in FIG. 3, for instance, i×j pieces of memory transistors MC11, MC12, . . ., MC21, MC22, . . . , Mcij are arranged in a matrix manner.

In FIG. 3, for simplification of the illustration, 2 rows and 4 columns (2×4) of 8 pieces of memory cells MC11, MC12, MC13, MC14, MC21, MC22, MC23, and MC24 are only illustrated.

As illustrated in FIG. 3, respective memory cells MC11 to MC24, as described above, adopt a configuration in which the selection transistor ST is arranged in such a way as to share a channel formation region between the first memory transistor MT1 and the second memory transistor MT2 with the charge accumulated layer CAM.

The gates of the selection transistors ST of the memory cells MC11 to MC14, thus arranged in the first row, are connected commonly to the word line WL1, and the gates of the selection transistors ST of the memory cells MC21 to MC24, thus arranged in the second row are connected commonly to the word line WL2.

Actually, as illustrated in FIG. 4, the gate of the selection transistor ST is constituted by the word line WL.

Further, the control gate of each first memory transistor MT1 of the memory cells MC11 and MC21, thus arranged in first column, is connected to common control gate line CLL1, and the control gate of each second memory transistor MT2 is connected to common control gate line CLR1.

Similarly, the control gate of each first memory transistor MT1 of the memory cells MC12 and MC22, thus arranged in the second column, is connected to common control gate line CLL2, and the control gate of each second memory transistor MT2 is connected to common control gate line CLR2.

The control gate of each first memory transistor MT1 of the memory cells MC13 and MC23, thus arranged in the third column, is connected to common control gate line CLL3, and the control gate of each second memory transistor MT2 is connected to common control gate line CLR3.

The control gate of each first memory transistor MT1 of the memory cells MC14 and MC24, thus arranged in the fourth column, is connected to common control gate line CLL4, and the control gate of each second memory transistor MT2 is connected to common control gate line CLR4.

Further, as illustrated in FIG. 4, the sources of the respective first and second memory transistors MT1, MT2 are connected to the drain region of another memory transistor adjacent to one side of the word line direction, and the drain of the respective memory transistors is connected to the source of another memory transistor adjacent to the other side of the word line direction. These common sources and drains are constituted by a line shaped source-drain impurity region that connects another drain in the direction of the bit line with connecting portion of the drain.

The respective source-drain impurity regions formed in such a manner, as illustrated in FIG. 5, come to parallel stripe shaped pattern in the whole memory-cell array.

In the present embodiment, these source-drain impurity regions are employed as the bit lines BL1, BL2, BL3, c as they are.

However, it is suitable that there are provided bit lines BL1, BL2, BL3, . . . made of a metal wiring layer on the upper layer of respective source-drain impurity regions. In this case, respective bit lines BL1, BL2, BL3, . . . are wired in the direction of the bit line while making contact appropriately with the corresponding lower layer of the source-drain impurity region.

Figure 6:
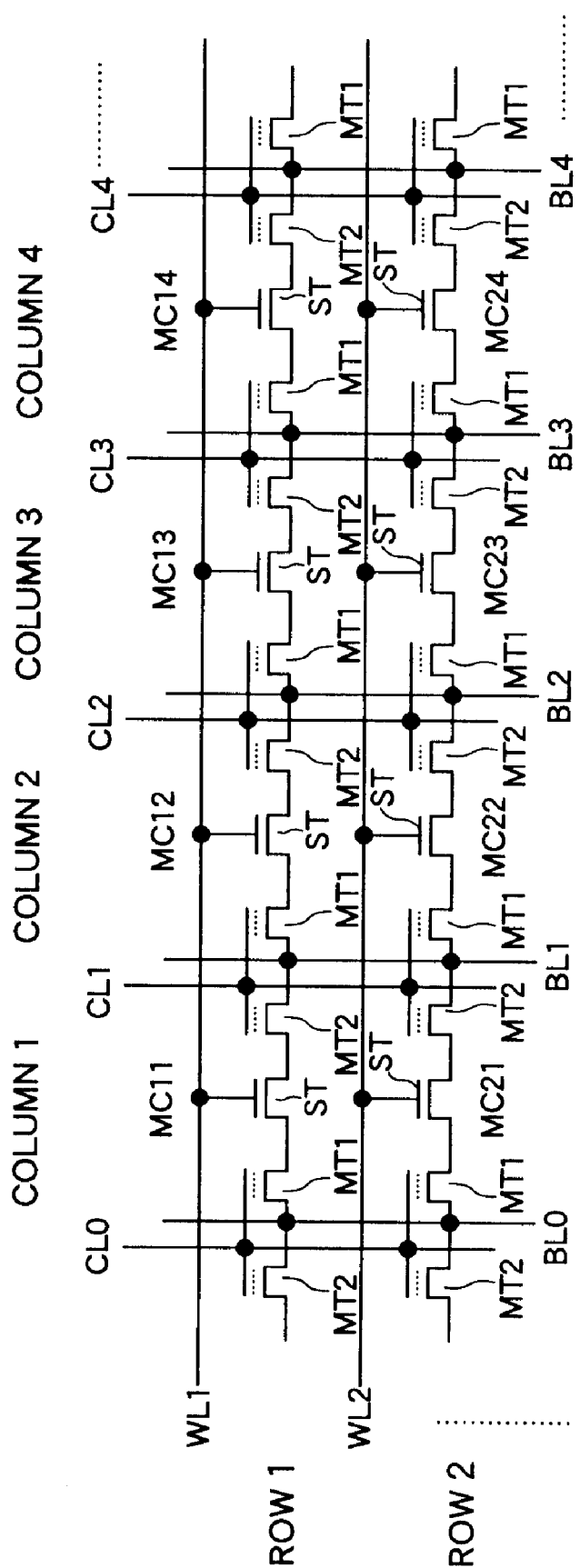
FIG. 6 is an equivalent circuit view illustrating the control gate shared type memory-cell array according to the present embodiment.
Figure 7:
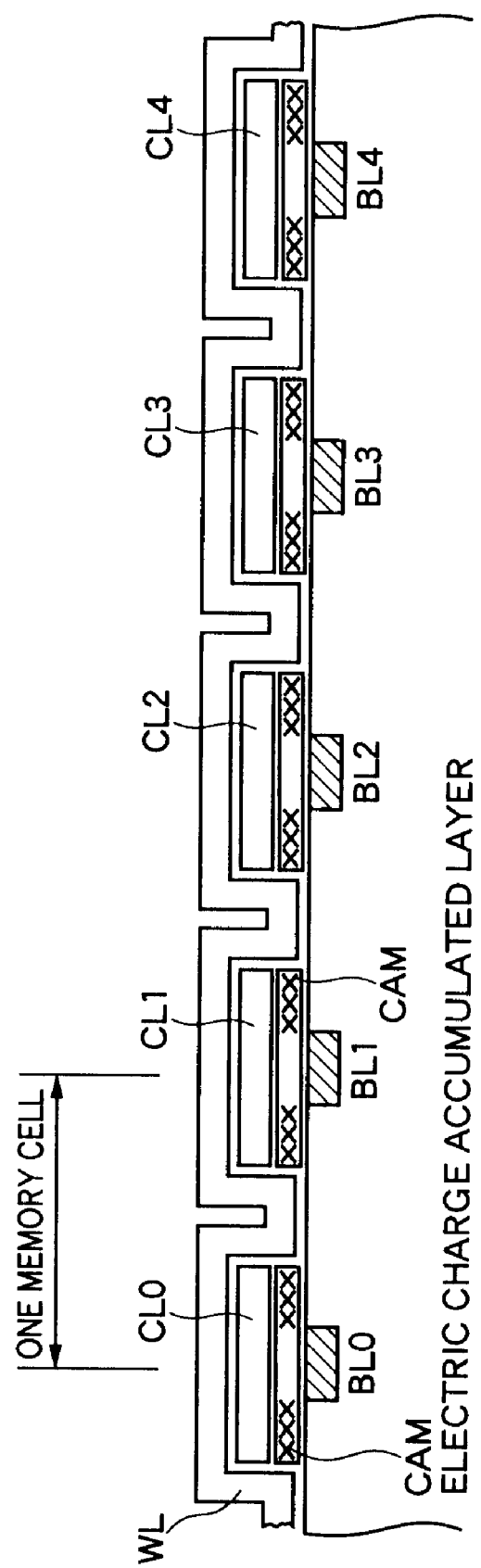
FIG. 7 is a schematic portional view along the direction of the word line of the control gate shared type memory-cell array according to the present embodiment.
Figure 8:
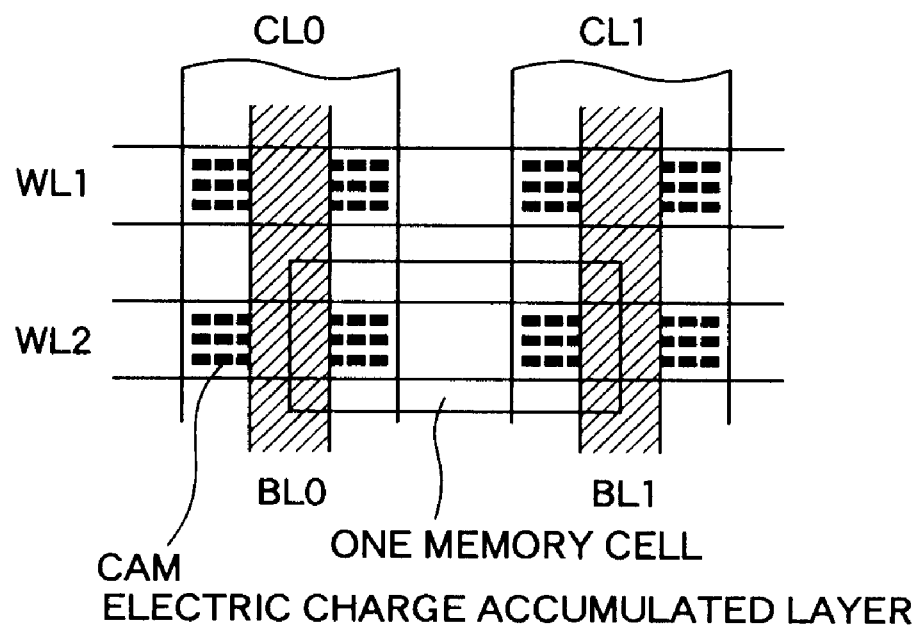
FIG. 8 is a plan view of a part (one row of FIG. 2) of the control gate shared type memory-cell array according to the present embodiment.

The control gate shared memory-cell array is illustrated in FIG. 6 to FIG. 8.

FIG. 6 is an equivalent circuit view illustrating the control gate shared memory-cell array. FIG. 7 is a schematic portional view along the direction of the word line of the control gate shared memory-cell array. FIG. 8 is a plan view of a part (first column of FIG. 6) of the control gate shared memory-cell array.

In the control gate shared memory-cell array 121B, as illustrated in FIG. 6, as in the control gate separation memory-cell array 121A of FIG. 3, for instance, i×j pieces of memory transistors MC11, MC12, . . ., MC21, MC22, . . . , Mcij are arranged in a matrix shape.

In FIG. 6, for simplification of the illustration, 2 rows and 4 columns (2×4) of 8 pieces of memory cells MC11, MC12, MC13, MC14, MC21, MC22, MC23, and MC24 are only illustrated.

The control gate shared memory-cell array 121B is different from the control gate separation memory-cell array in that the first and the second memory transistors MT1 and MT2 of the respective memory cells and the memory transistors MT2 and MT1 of the adjacent memory cell have the control gate CG in common, and the first and the second memory transistors MT1 and MT2 of the memory cell connected in the same column are connected to common control gate line CL.

Concretely, the control gates of the respective first memory transistors MT1 of the memory cells MC11 and MC21 arranged in the first column are connected to the control gate line CL0 common to the control gate of the second memory transistor MT2 of the not illustrated memory cells MC10 and MC20, which are positioned to the left in the drawing, and the control gates of the respective second memory transistors MT2 of the memory cells MC11 and MC21 are connected to the control gate line CL1 common to the control gate of the first memory transistor MT1 of the memory cells MC12 and MC22 which are positioned to the right in the drawing.

Similarly, the control gates of the respective second memory transistors MT2 of the memory cells MC12 and MC22 are connected to the control gate line CL2 common to the control gate of the first memory transistor MT1 of the memory cells MC13 and MC23, which are positioned to the right in the drawing.

The control gates of the respective second memory transistors MT2 of the memory cells MC13 and MC23 are connected to the control gate line CL3 common to the control gate of the first memory transistor MT1 of the memory cells MC14 and MC24, which are positioned to the right in the drawing.

The control gates of the respective second memory transistors MT2 of the memory cells MC14 and MC24 are connected to the control gate line CL4 common to the control gate of the first memory transistor MT1 of the memory cells MC15 and MC25. which are positioned to the right in the drawing.

Since another construction is the same as that of the aforementioned control gate separation memory-cell array, here, the detailed explanation is omitted.

As to the charge accumulated layer CAM, in the case of the control gate separated type, the charge accumulated layer CAM is a floating gate (FG) or an insulating film, including nitride film, while in the case of the control gate shared type, the charge accumulated layer CAM is an insulating film, including nitride film, capable of carrying out a discrete trap.

For instance, in the respective memory transistors MT1 and MT2, in the case of the MONOS-type, at the insulating film portion directly under the control gate, a laminated construction of a plurality of insulating films, including a boundary between the oxide film and the nitride film, as used.

Further, in the case of FG type or nano-crystal type, at least a plurality of insulating films are formed at a portion directly under the control gate, and single film shaped conductive material or conductive material diffused in innumerable fine diameter grain are embedded between the insulating films. Such conductive materials or boundary surface between the oxide film and the nitride film and the carrier trap within the nitride film function as a charge accumulating means of the memory transistor.

The threshold voltage Vth of the memory transistor changes according to the charge accumulated quantity of the charge accumulating means.

When writing is carried out by using channel hot electron injection, the charge accumulated quantity varies depending on the electric field in the lateral direction applied to the channel that is turned ON when writing. The electric field in the lateral direction is determined according to the bit line voltage. Namely, the write data communicated to the memory cell as the existence of voltage establishment of the bit line is converted into the difference of the threshold voltage Vth when writing, thus being stored in the memory cell.

When reading, the voltage by which the memory transistor turns ON or OFF in compliance with the logic of the storage data is applied to the transistor gate through the word line under the condition that the predetermined read drain voltage is applied between both bit lines. According to this operation, only when the memory transistor turns ON, current flows between both bit lines through the channel, and thus the voltage of the bit line is changed. The existence of change in the bit line voltage is made to read by detecting it by the sense amplifier SA and so forth. Namely, when reading, contrary to writing, the storage data is inverted into the difference of the bit line voltage instead of the difference of the threshold voltage Vth of the memory transistor; thus, it becomes possible to communicate to the external portion.

Moreover, as the charge accumulated layer CAM, it is desirable to employ a MONOS-type (or a MNOS-type). Its reason will be described as follows.

In the MONOS non-volatile semiconductor memory transistor, the carrier trap within the nitride film [Six Ny (0<x<1, 0<y<1)], which bears charge holding independently, or the carrier trap of the boundary between the top oxide film and the nitride film spreads discretely and spatially (namely, in the surface direction and in the film width direction) and, accordingly, the charge holding characteristic is dependent on the distribution regarding both the energy and space of the charge captured by the carrier trap within the Six Ny film except, for the tunnel insulating film thickness.

When the leak current path occurs locally on this tunnel insulating film, in the FG type, the charge holding characteristic deteriorates easily because a great deal of charges leak while passing through the leak path. Ceontrary thereto, in the MONOS-type, the charge accumulating means exist spatially and discretely and therefore, only local charges adjacent to the leak path leak locally passing through the leak path, and thus the charge holding characteristic of the whole storage element is difficult to deteriorate.

For that reason, in the MONOS-type, the disadvantage of deterioration of the charge holding characteristic of thin film of the tunnel insulating film is not as serious as with the FG type. Consequently, the MONOS-type is superior to the FG type in connection with scaling characteristic of the tunnel insulating film in a fine memory transistor whose gate length is extremely short.

Further, when the MONOS-type is employed, if the charge is injected locally to the distributed plane of the carrier trap spread flatly, the charges are held without spreading flatly and in the film thickness direction as with the FG type.

The MONOS-type is capable of operating at high speed when giving consideration to the writing speed. For instance, it is possible to apply a source side injection type MONOS (NMOS) transistor in which a channel hot electron (CHE) is made to inject from the source side.

Figure 9:
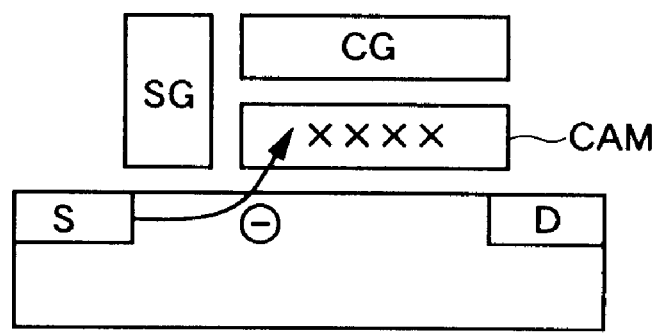
FIG. 9 is a view explaining source side injection.

This source side-channel hot electron injection, for instance, as illustrated in FIG. 9, the selection gate SG is made to arrange in the side of the control gate CG to be on the source side of the memory transistor and the charge accumulated layer CAM.

Then, a high electric field is made to form in the boundary region between the selection gate SG and the charge accumulated layer CAM in such a way that a high voltage is made to apply to the control gate CG, while low voltage is made to apply to the selection gate SG, and is followed by injecting a channel hot electron into the charge accumulated layer CAM in the arrow direction in the drawing.

The injection efficiency thereof is higher than in the ordinary channel hot electron injection method in which a channel hot electron is injected at the drain side, and accordingly, it is possible to shorten the writing time.

Further, this source side-channel hot electron injection also is applicable to the floating gate FG of the charge accumulated layer or the MONOS (MNOS) memory transistor including nitride film.

Furthermore, the MONOS (NMOS) memory transistor is capable of writing binary information independently to the source side and the drain side of the charge accumulated layer because the charge can be made to inject to a part of the discrete trap due to the CHE injection method. Accordingly, it is possible to write 2 bits per 1 memory cell.

In this case, for instance, 2 bits of information are made to write by CHE injection while changing the voltage application direction between the source and the drain, while when reading, predetermined voltage is made to apply between the source and the drain in the reverse direction against the time of the writing, which is the so-called "reverse read" method. It is possible to read surely the 2 bits information, even though the accumulated charge quantity is small, which is caused by short writing time.

Accordingly, in the case of control shared-type, described above, the MONOS (MNOS) memory transistor is appropriate.

Figure 10:
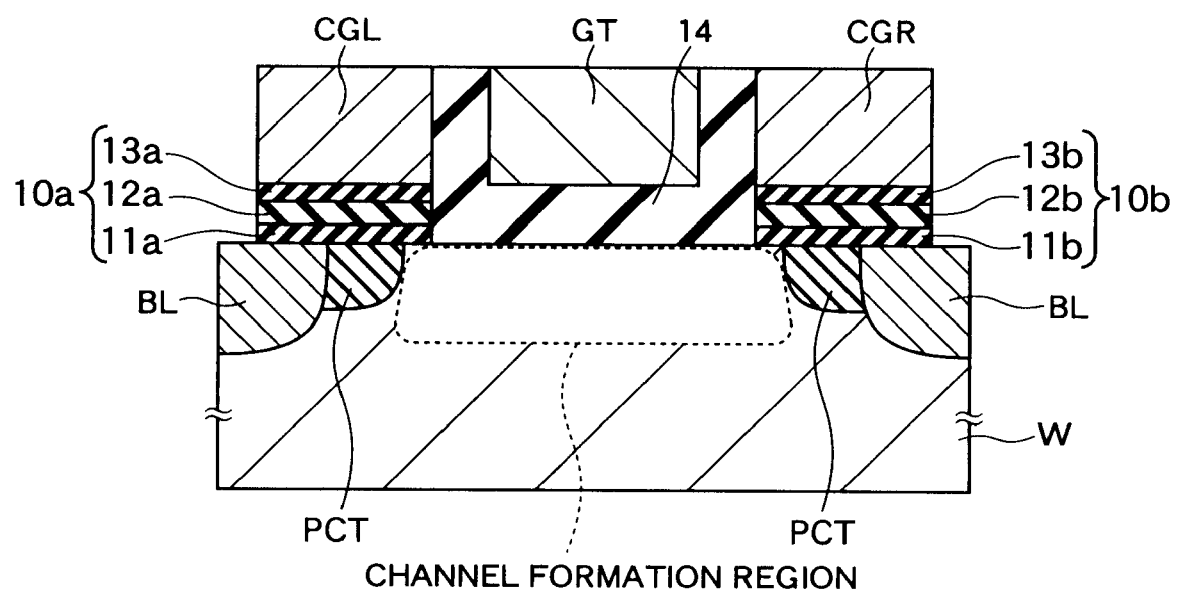
FIG. 10 is a portional view illustrating a concrete configuration example of a MONOS-type memory transistor.

FIG. 10 is a portional view illustrating a concrete construction example of the MONOS memory transistor.

As illustrated in FIG. 10, the memory transistor has a gate electrode GT of the selection transistor ST connected to the word line WL formed on the center portion of the channel formation region of the semiconductor substrate W, a control gate CGL for the first memory transistor provided at both sides of the channel direction and that is insulated and separated from the gate electrode GT, and a control gate CGR for the second memory transistor.

Further, in the memory transistor, gate insulating films 10a, 10b are formed between the control gates CGL, CGR and the bit line BL or the channel formation region terminal portion respectively.

The gate insulating film includes, for instance, a bottom insulating film 11a, a nitride film 12a, and a top insulating film 13a. Also, the gate insulating film 10b includes, for instance, a bottom insulating film 11b, a nitride film 12b, and a top insulating film 13b.

The gate electrode GT is embedded between two control gates CGL, CGR separated spatially in both the source side and the drain side and the laminated pattern of the gate insulating films 10a, 10b through the insulating film 14.

Further, the gate electrode GT is connected to an upper wiring layer to be the word line WL, which is not illustrated, thus being connected commonly between memory cells in the word line direction.

Thus, in the memory transistor, the selection MOS transistor connected to the word line is formed at the center portion of the channel formation region. The control gates CGL, CGR are arranged through the gate insulating films 10a, 10b of an ONO film type including a charge accumulating means at the upper portion of pocket region PCT formed by oblique ion injection and a diffusion layer (bit line BL).

This combination between the selection gate GT and the control gates CGL, CGR is fundamentally the same as the memory cell of the source side injection type of the split gate construction.

Further, it is suitable to use any silicon nitride film exhibiting the FN tunneling characteristic, e.g., silicon oxide nitride film, or another dielectric film, such as a multi-layer film, e.g., tantalum oxide film, and so forth as the bottom insulating film at the lowest layer of the gate insulating film.

For this reason, in source side injection, the energy obstacle at the side of the conduction band is reduced from 3.2 eV in the case of oxide film; thus, the injection efficiency of the hot electron is improved.

Furthermore, the selection MOS transistor is employed for carrying out source side injection efficiently when writing. Moreover, when erasing, even when the charge accumulating means is over-erased, the selection MOS transistor accomplishes the role of holding the threshold voltage Vth constantly in the erase condition of the memory transistor. For this reason, the threshold voltage of this selection gate MOS transistor is established, for instance, between 0.5 V and 1 V.

Next, a programming method for the memory-cell array having the construction described above will be explained with reference to the drawing.

Figure 11:
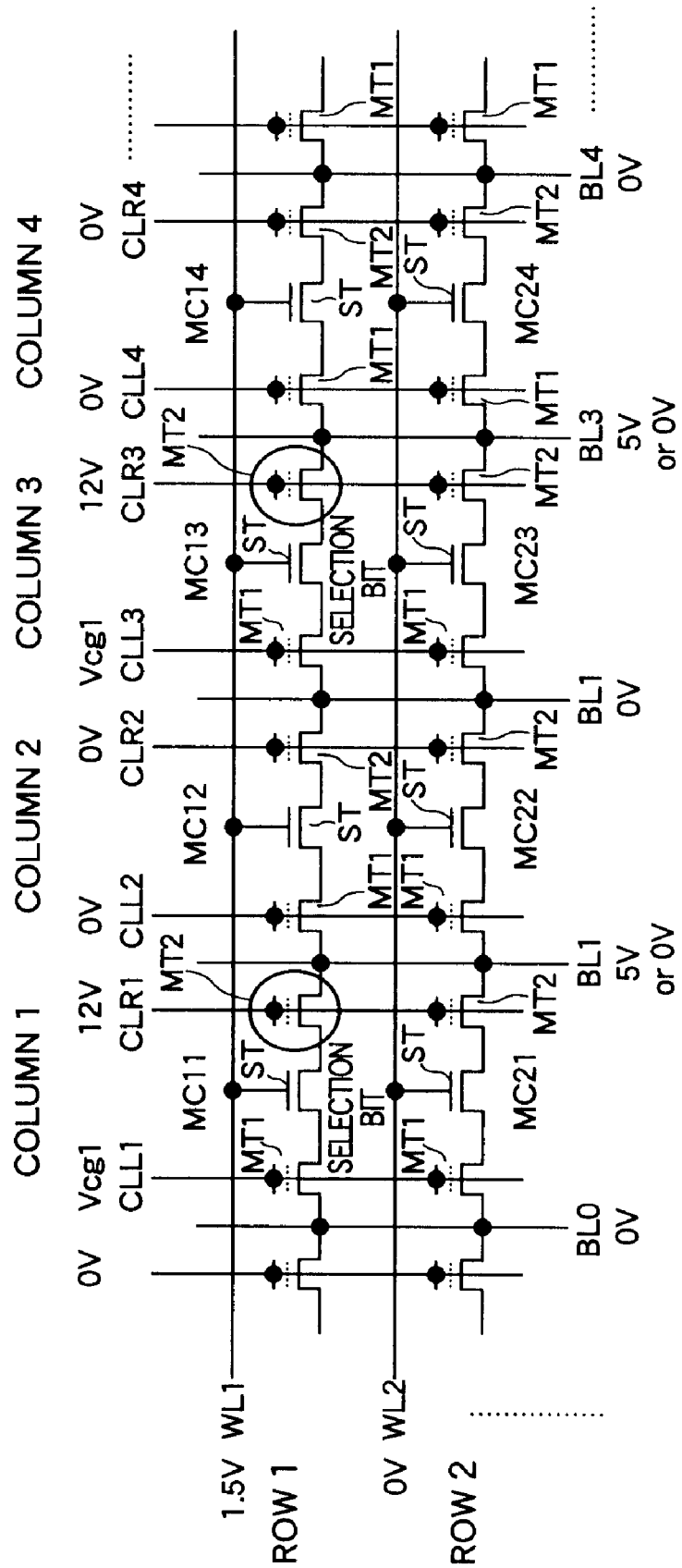
FIG. 11 is a view illustrating a programming condition of the control gate separation type memory-cell array.
Figure 12:
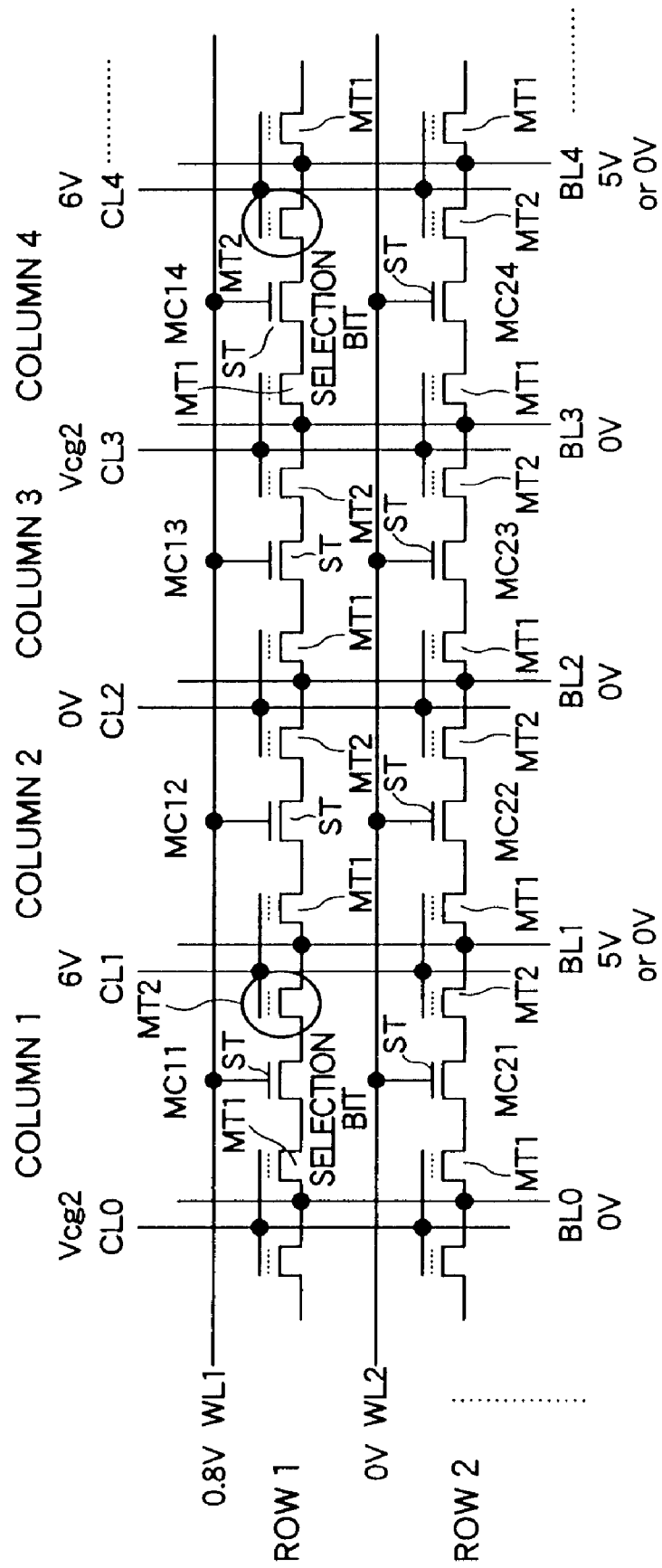
FIG. 12 is a view illustrating a programming condition of the control gate shared type memory-cell array.

FIG. 11 is a view illustrating a programming condition of the control gate separation memory-cell array. FIG. 12 is a view illustrating a programming condition of the control gate shared memory-cell array.

Further, it will now be explained how the programming is carried out to the second memory transistor at the right hand side of memory cell MC11.

The programming data are provided to the emulation circuit 122 through the external interface 126 of the controller portion 11, and further through the memory interface 127.

In the emulation circuit 122, the register 1221 stores therein the command CMD and the address ADR. Then if the register 1221 stores therein the unit data of the division data (for instance, 64 bytes=512 bits), the register 1223 stores collectively therein the division data. Then, control circuit 123 is informed of the storage of the divided unit data. The divided unit data $D_{in}$ stored in the register 1223 is output to the input/output circuit 126 under the control of the control circuit 123 on the basis of the above information.

In such a condition, the programming operation to the control gate separation memory-cell array will be explained with reference to FIG. 11.

As to the control gate separated type, if the charge accumulated layer is, for instance, the floating gate FG, voltage of 0 V is made to apply to the bit line BL0 at the source side, voltage of 5 V or 0 V is made to apply to the bit line BL1 at the drain side, low voltage of 1.5 V is made to apply to the word line WL1 connected to the gate of the selection transistor, and high voltage of 12 V is made to apply to the control gate line CLR1 connected to the control gate of the second memory transistor MT2 which is the select bit portion.

With respect to the not selected left hand side bit portion (the first memory transistor MT1) within the memory cell MC11, in order to possess a role for communication so as to flow required channel current regardless of the kind of storage data of that part, appropriate voltage Vcgl is applied to the control gate line CLL1 connected to the control gate of the first memory transistor MT1.

According to these bias conditions, the programming is carried out to the second memory transistor MT2 of the memory cell MC11 to be the select bit.

The memory cell MC12 adjacent to the selection memory cell MC11, in order to avoid error writing caused by applied voltage to the bit line BL1 at the drain side of the selection memory cell MC11, voltage of the control gate line CLL2 connected to the control gate of the first memory transistor MT1 and the control gate line CLR2 connected to the control gate of the second memory transistor MT2 is set to 0 V to interrupt the channel current.

The aforementioned voltage for applying to the control gate lines CLL, CLR is provided by the control circuit 123 selectively.

Here, all threshold voltage of the transistor controlled by the control gate is set to positive voltage regardless of the kind of the storage data.

Further, it is possible to carry out the same programming to the bit within the memory cell 13 that is set apart one in the direction of the word line of the select memory cell 11.

Furthermore, voltage of 0 V is made to apply to the not selected word line WL2 to interrupt the channel current.

Finally, in this control gate separation memory-cell array 121A, with respect to the select word line, it is possible to carry out programming per 4 bits.

Next, the programming operation to the control gate shared memory-cell array will be explained with reference to FIG. 12.

As to the control gate separated type, if the charge accumulated layer is the MONOS-type that includes the nitride film, voltage of 0 V is made to apply to the bit line BL0 connected to the source side, voltage of 5 V or 0 V is made to apply to the bit line BL1 connected to the drain side, low voltage of 0.8 V is made to apply to the word line WL1 connected to the gate of the selection transistor SG, and high voltage of 6 V is made to apply to the control gate line CL1 connected to the control gate of the second memory transistor MT2 which is the selection bit portion.

With respect to the not selected left hand side bit portion (the first memory transistor MT1) within the memory cell MC11, in order to possess a role for communication so as to flow required channel current regardless of the kind of storage data of that part, appropriate voltage vcg2 is applied to the control gate line CL0 connected to the control gate of the first memory transistor MT1.

According to these bias conditions, the programming is carried out to the second memory transistor MT2 of the memory cell MC11 to be the select bit.

The memory cell MC12 adjacent to the selection memory cell MC11, in order to avoid error writing caused by applied voltage to the bit line BL1 at the drain side of the selection memory cell MC11, voltage of the control gate line CL2 connected to the control gate of the second memory transistor MT2 is set to 0 V to interrupt the channel current.

Further, adjacent memory cell MC13, including the first memory transistor MT1 which shares the control gate (CL2) with the second memory transistor MT2 of the memory cell MC12, becomes non-selection.

Further, it is possible to carry out the same programming to the bit within the memory cell 14 that is set apart two in the direction of the word line of the select memory cell MC11.

Furthermore, voltage of 0 V is applied to the not selected word line WL2 to interrupt the channel current.

Finally, in this control gate shared memory-cell array 121B, with respect to the selection word line, it is possible to carry out programming per 6 bits.

First Programming Method

Next, the number of the programming pulse application is made to set for the bit. Here, the bit of the word line unit is taken as a page, on the supposition that the page size is 512 bytes as described above.

Logically, according to the above-described example, it is possible to carry out the programming in every 4 bits or in every 6 bits in the direction of the word line. However, it is assumed that the programming may be made to carry out in every 8 bits in order to make it clearly understandable. Accordingly, with respect to 1 word line, the number of bits for carrying out the programming simultaneously is 512 bit line BL (=512 bytes/8=64 bytes)

Figure 13:
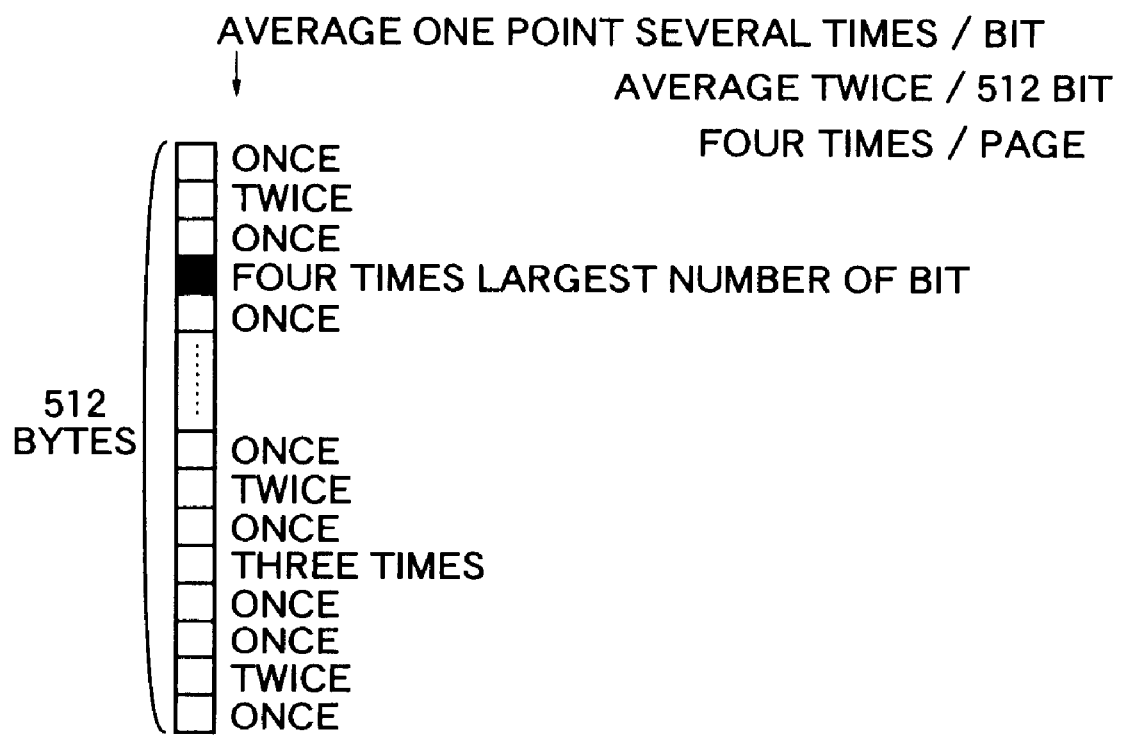
FIG. 13 is a view illustrating an example of the number of times of programming pulse application to a bit on the word line.

FIG. 13 is a view illustrating the number of times of programming pulse application against the bit on the word line.

In the respective bits, the bit whose voltage does not reach to the write threshold voltage by one time of the pulse appears. In the distribution of the whole 4096 bits (=512 bytes), a lot of bits are 1 time and decrease extremely in accordance with the order of 2 times, 3 times, and 4 times.

The average number of times of the programming pulse application is about 1.5 times per bit. The average number of times of the programming pulse application is 2 times per 512 bits of the simultaneous programming unit. The average number of times of the programming pulse application is 4 times per page.

Here, with respect to 512 bits and 1 page, the number of times becomes the greatest number of bits; therefore, the greater becomes a bit unit, and the larger is the number of application.

One time of the programming cycle is separated largely into, as illustrated in FIG. 14, the programming pulse application and the step of verification, and the total time of the two is set to 20 $\mu$s.

When taking into account the actual programming time, actually, it is necessary to take into account the time necessary for loading program information into the column latch circuit existing ahead of the bit line; however, here that time is ignored because it is short.

Here, the programming time for one page is made to consider.

Concretely, the simultaneous programming pulse application is made to carry out against 512 bits existing in every 8 bits in the direction of the word line; subsequently, the programming pulse application is made to carry out against the adjacent 512 bits thereto.

8-times repetition of this 512 bits simultaneous programming step comes to the programming pulse application corresponding to one page (512 bytes). The verification for one page is made to carry out continuously after the programming pulse application for one page (512 bytes).

Further, as the case condition of the verification, for instance, in the case of the control gate separated type, a voltage of 1.5 V is made to apply to the control gate line CLR1 connected to the control gate of the memory transistor MT2 of the selection bit of the selection memory cell MC11, a voltage of 8 V is made to apply to the control gate line CLL1 connected to the control gate of the memory transistor MT1 of the selection memory cell MC11, a voltage of 1.5 V is made to apply to the bit line BL0 at the source side, and a voltage of 0 V is made to apply to the bit line BL1 at the drain side.

It is necessary to carry out this verification at intervals of several bits in the direction of the word line in the same way as the programming; thus, it is assumed that the verification is made to carry out in every 8 bits.

Also in the verification operation, 8-times repetition of this 512 bits simultaneous to the verification step comes to the verification corresponding to one page (512 bytes).

As described above, 4 times of the programming pulse application are required for each page. Namely, the programming is completed by carrying out 4 times the cycle of the programming pulse application of one page unit and verification.

FIG. 15 is a view illustrating the number of times of the programming pulse application and the number of times of the verification while picking out.

As illustrated in FIG. 15, finally, a pair of the programming pulse application and the verification come to the programming cycle of total 32 times; therefore, the programming time for one page comes to 640 $\mu$s (20 $\mu$s×32 times).

This programming time is improved in comparison with the conventional maximum 1500 $\mu$s of the memory system.

In case of the above-described example, the programming speed is converted into 0.8 Mbyte/s (=512 byte/640 $\mu$s).

The second and the third programming methods that realize programming in which programming speed is even higher and more than, for example, several MByte/s will be explained below.

Second Programming Method

Also, in this case, the bit of the word line unit is taken as a page on the supposition that the page size is 512 bytes; thus, the programming time for 1 page is made to consider.

Concretely, the simultaneous programming pulse application is made to carry out to, for instance, 512 bits existing in every 8 bits in the direction of the word line, and the verification of the same 512 bits is made to carry out continuously.

For instance, as illustrated in FIG. 13, it is assumed that the number of times of the programming pulse application an average of 2 times per 512 bits is required. Namely, for a 512-bit unit, the programming is completed in such a way as to carry out the cycle of the continuous programming pulse application and verification an average of 2 times.

Next, as for 512 bits of adjacent bit thereto, the programming is completed in such a way as to carry out an average of 2 times of the cycle of the continuous programming pulse application and verification. The programming of 1 page (512 bytes) is completed in such a way as to repeat 8 times a step consisting of an average of 2 cycles of the continuous programming pulse application and the verification of 512 bits.

FIG. 16 is a view illustrating the number of times of the programming pulse application and the number of times of the verification while picking out.

As illustrated in FIG. 16, according to the second programming method, finally, a pair of the programming pulse and the verification comes to a programming cycle of total 16 times; therefore, the programming time for one page comes to 320 $\mu$s (20 $\mu$s×16 times).

In the case of the above-described example, the programming speed is converted into 1.6 Mbyte/s (=512 Byte/320 $\mu$s). This is 2 times the speed of the first programming speed.

This reason causes the difference of the number of times of the programming pulse application.

There is a tendency that the larger the bit unit to which the programming pulse is applied, the more the number of times of application becomes. In the example of FIG. 13, the number of times of application is an average of 2 times in every 512 bits and an average of 4 times for each page.

In the present second method, since a 512-bit unit is adopted, the number of programming applications becomes ½ of 1 page; accordingly, the programming speed becomes 2 times that of 1 page unit.

This programming speed is suitable for a device which requires value more than several Byte/s, for instance, a memory card and so forth.

Third Programming Method

In the present third programming method, a page is made to constitute by a plurality of divided circuits, such as, for instance, a plurality of chips or a plurality of mats.

Figure 17:
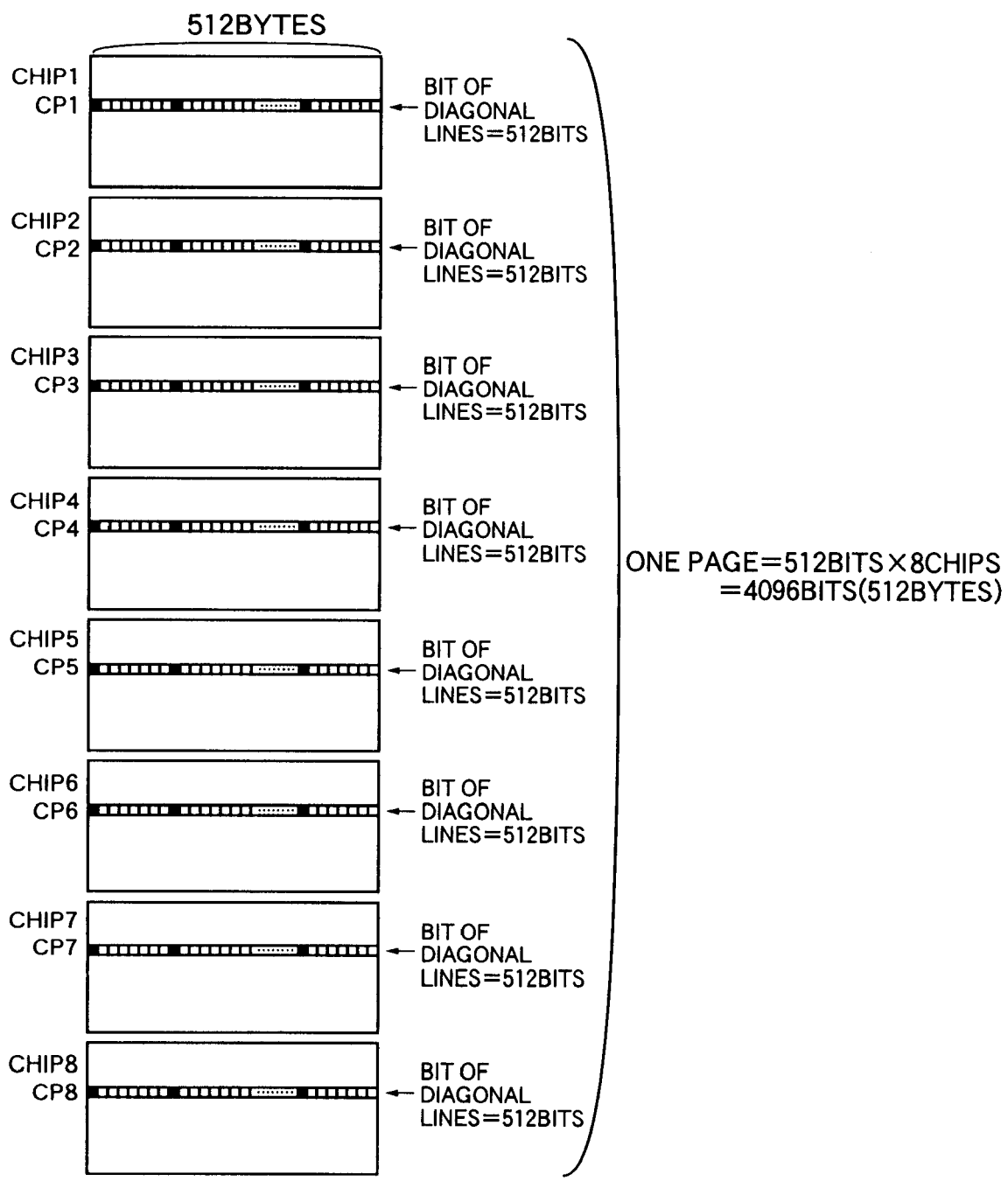
FIG. 17 is a view explaining a page configuration where one page is divided into 8 chips.

For instance, as illustrated in FIG. 17, a page having a size of 512 bytes is made to constitute by 8 pieces of divided circuits, such as, for instance, mats MM1 to MM8.

By such a constitution, the number of bit becomes 512 bits for each mat, and the 512 bits is made to constitute, for instance, as illustrated in FIG. 17, by the bits in every 8 bits in the direction of the word line.

In this case, as for all 8 mats MM1 to MM8, the simultaneous programming pulse application is made to carry out to 512 bits existing in every 8 bits in the direction of the word line, and the verification of the same 512 bits is made to carry out continuously.

Four times the number of times of the programming pulse application for each page should be required, for instance, regardless of the condition of extending over the mat.

Namely, as for the page unit, the programming is completed in such a way as to carry out an average of four times of the cycle of continuous programming pulse application and verification.

Since 512 bits becomes 1 page while extending over 8 chips, the programming for 1 page (512 bytes) is completed by only these steps without shifting to an adjacent bit.

In this case, the programming for 1 page is made to consider.

FIG. 18 is a view illustrating the number of times of the programming pulse application and the number of times of the verification while picking them out.

As illustrated in FIG. 18, according to the third programming method, finally, a pair of the programming pulse and the verification come to the programming cycle a total of 4 times; therefore, the programming time for one page comes to 80 $\mu$s (20 $\mu$s×4 times).

In case of the above-described example, the programming speed is converted into 6.4 Mbyte/s (=512 Byte/80 μs). This speed becomes 8 times that of the first programming speed. Further, this speed becomes 4 times that of the second programming speed.

According to the present third programming method, there is an advantage that it becomes possible to reduce drastically the programming time.

Further, in the explanation provided-above, as for memory-cell array 1, for instance, the simultaneous programming pulse application is made to carry out against 512 bits existing in every 8 bits in the direction of the word line. This is an equal value that the parallel operation is made to carry out while dividing the memory-cell array into a plurality of mats.

Figure 19A:
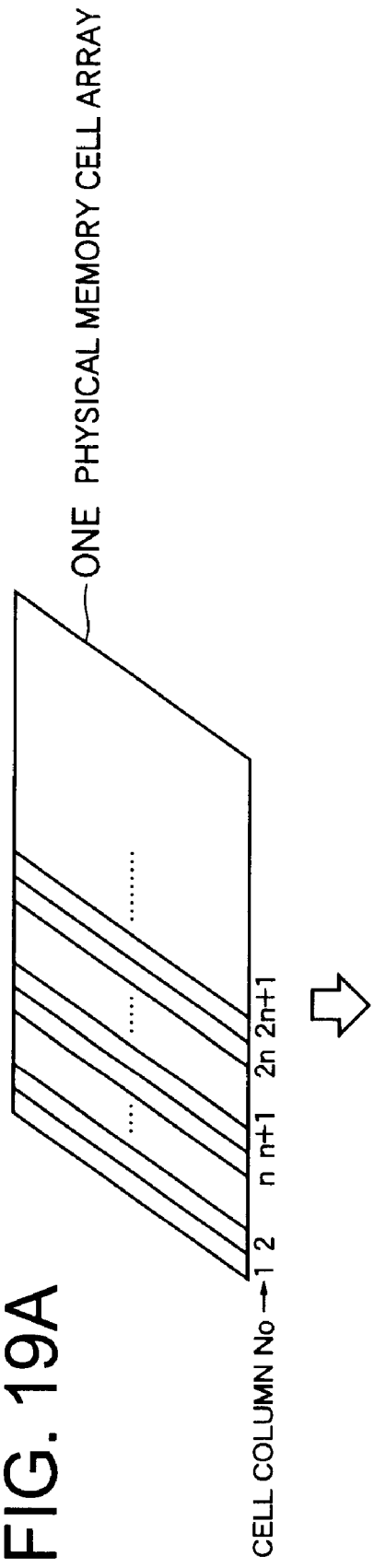
FIGS. 19A and 19B are views illustrating the concept of division of the memory-cell array according to the present embodiment.
Figure 19B:
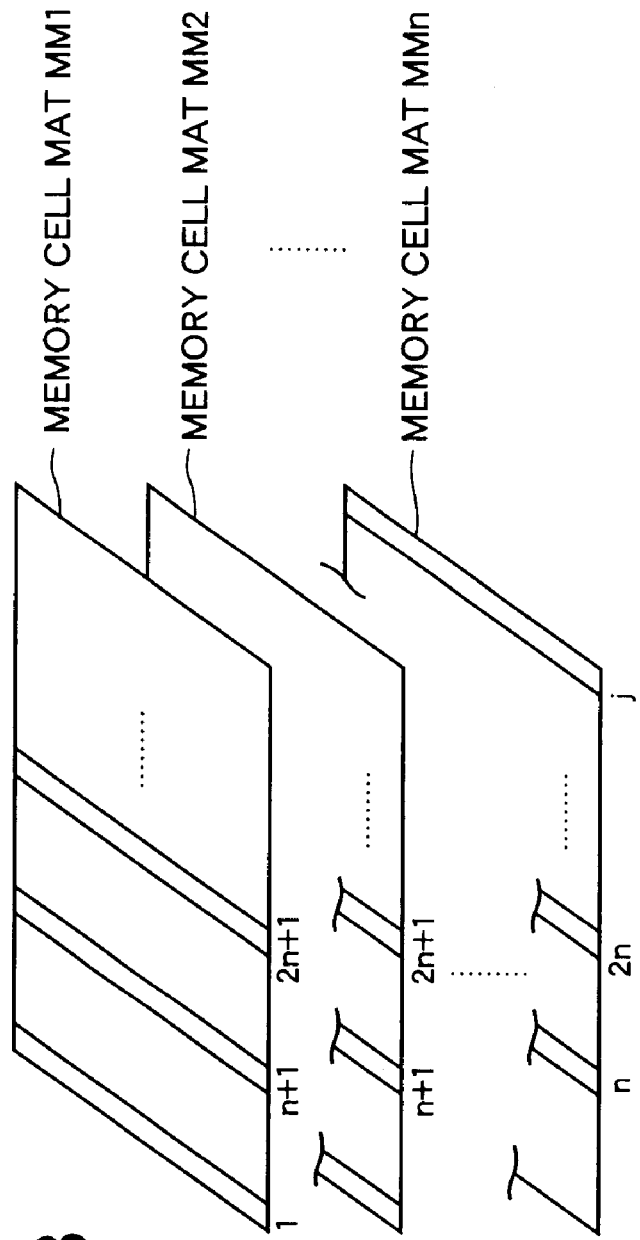

FIGS. 19A and 19B are views illustrating the concept of division of the memory-cell array according to the present embodiment.

FIG. 19A illustrates physical memory-cell array 1, in the drawing, serial numbers 1, 2, ..., n, n+1, ..., 2n, 2n+1, ..., j are added to the memory cell column.

Then, for instance, on the occasion of this programming, the read operation, or the erase operation, the control circuit 123 of FIG. 2 divides the memory transistor in the direction of the word line into a plural number, and thus the memory-cell array is divided into an integer n pieces more than 3 of the memory cell mats MM1, MM2, ..., MMn. The respective memory cell mats MM1, MM2, ..., MMn include cyclically dispersed memory cell column. Namely, the memory cell mat MM1 includes memory cell columns 1, n+1, 2n+1, ...; the memory cell mat MM2 includes memory cell columns 2, n+2, 2n+2, ...; and the final memory cell mat MMn includes memory cell columns n, 2n, ..., j.

Then, in the present embodiment, it causes the memory transistor within any one of the selected memory cell mats to execute a parallel operation.

Thus, in the present invention, it is possible to set the number of the memory cell mat n arbitrarily. Further, it is possible to cope therewith in such a way that the number of the control gate for impressing interrupting voltage continuously at the divided portion is set to, for instance, (n−2) control gates.

Figure 20:
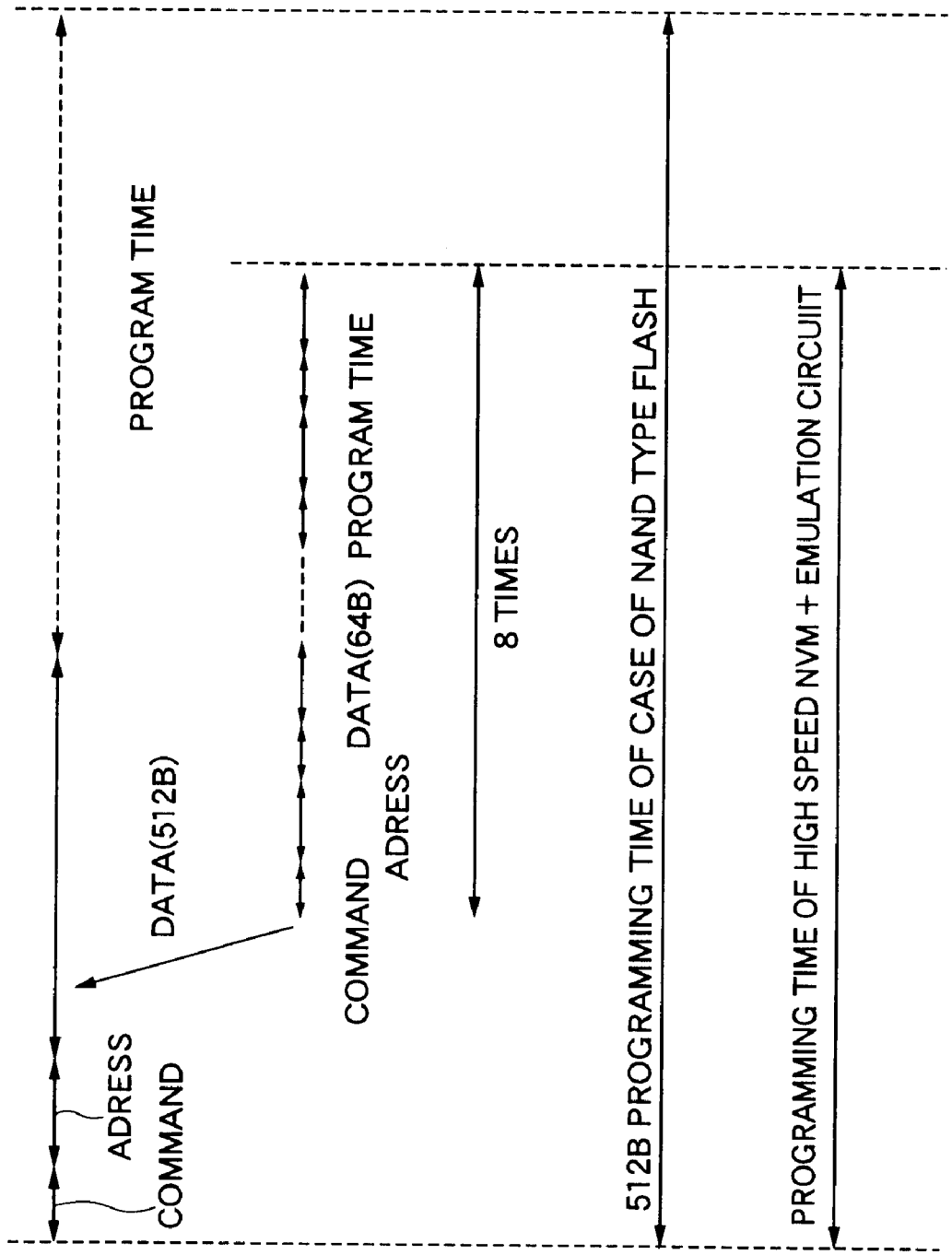
FIG. 20 is a view explaining the effects of the present invention.

As described above, according to the present embodiment, the memory-cell array is made to constitute by a MONOS-type (MNOS-type) non-volatile memory or a floating-gate type non-volatile memory for carrying out source side-channel hot electron injection capable of writing data with a divided unit (for instance, 64 byte=512 bits) different from the case where write of page unit (512 bytes) is carried out collectively, and there are provided the emulation circuit 122 for holding successively the programming data, which constitutes a page in the condition of being divided into a plurality of divided units, and a control circuit 123 for reading successively the divided unit data thus held to write. Accordingly, it is possible not only to carry out write or read in parallel against a plurality of memory transistors, but also, as illustrated in FIG. 20, it is possible to scheme a high speed programming operation, including verification, in comparison with the case where writing for a page is made to carry out collectively while employing conventional NAND flash memory.

Further, according to the present embodiment, a page is made to constitute in such a way as to range over a plurality of mats (or chips), the simultaneous programming pulse application is made to carry out against a bit unit existing in every several bits on the word line extending over a plurality of mats, and the verification of the same bit unit is made to carry out continuously; and accordingly, it is possible to carry out write or read in parallel to a plurality of memory transistors. There also is the advantage that it is possible to realize a higher speed programming operation including verification.

Furthermore, in the present embodiment, the example is explained in which the emulation circuit 122 is provided within the memory portion 120. However, the present invention is not limited by this case, as it may be possible to dispose it in the controller portion 110.

Moreover, the memory cell is made to constitute by the first memory transistor MT1, the second memory transistor MT2, and the selection transistor SG sharing the channel formation region therewith between the first and second memory transistors MT1, MT2, and the first memory transistor MT1, the second memory transistor MT2 are made to constitute by the MONOS-type (MNOS-type), non-volatile memory. Thereby, if a plurality of memory cells are connected in cascade connection, the control gate can be shared between the first memory transistor MT1 of the memory cell and the first memory transistor belonging to the memory cell adjacent thereto; thus, it is possible to reduce the number of control gate lines; and, further it is possible to achieve higher integration.

As described above, according to the present invention, write or read of data can be made to execute for a plurality of memory transistors in parallel, and thus it is possible to achieve a high speed programming operation.

While the invention has been described with reference to specific embodiments chosen for the purpose of illustration, it should be apparent that numerous modifications could be made thereto by those skilled in the art without departing from the basic concept and scope of the invention.

What is claimed is:

1. A memory system in which a program is completed with a page as a unit, comprising:
   an intermediate circuit successively holding program data that forms said page in a division unit where the program data are divided into a plurality of division units;
   a memory-cell array in which a plurality of memory cells, each including at least one memory transistor having a control gate controlling a charge accumulating means and a charge quantity accumulated in said charge accumulating means, and at least one selection transistor having a shared channel formation region and said memory transistor are arranged, and in which the plurality of memory cells arranged in the direction of a word line are connected in a cascade connection;
   word lines to which a gate of the selection transistor of each memory cell cascade-connected in the direction of said word line are commonly connected; and
   a control circuit successively reading the divided unit data held in said intermediate circuit when programming, electrically dividing said memory-cell array in every interval of a plurality of the memory cells in response to said division unit in the direction of the word line by driving the control gate of said memory transistor, and writing said division unit data to said memory-cell array by parallelly applying programming pulses to the control gates of the memory transistors in a predetermined bit unit.

2. A memory system according to claim 1, wherein said control circuit carries out an application of the programming pulse in parallel and continuously carries out the verification in all the same bit unit.

3. A memory system according to claim 1, wherein the charge accumulating means of said memory cell comprises an insulating film that includes a nitride film.

4. A memory system according to claim 1, wherein said memory cell includes a first memory transistor, a second memory transistor and a selection transistor formed to have a common channel formation region between said first memory transistor and said second memory transistor, and the charge accumulating means of both said memory transistor and said second memory transistor is included in the insulating film that includes the nitride film, and the first memory transistor of one memory cell and the second memory transistor of a memory cell adjacent to said one memory cell commonly have an insulating film as the control gate and the charge accumulating means.

5. A memory system in which a program is completed with a page as a unit comprising:

a plurality of divided circuits each having an intermediate circuit successively holding programming data that forms said page in a division unit where the program data is divided into a plurality of division units;

a memory-cell array in which a plurality of memory cells, including at least one memory transistor having a control gate controlling a charge accumulating means and a charge quantity accumulated in said charge accumulating means, and at least one selection transistor having a shared channel formation region and said memory transistor are arranged, and in which the plurality of memory cells arranged in the direction of a word line are connected in a cascade connection; and word lines to which a gate of the selection transistor of each memory cell cascade-connected in the direction of said word line are connected commonly; and a control circuit constituting pages in such a way as to range over a plurality of divided circuits, successively reading divided unit data held in said intermediate circuit when programming, electrically dividing said memory-cell array at intervals of a plurality of the memory cells corresponding to said divided unit in the direction of the word line by driving the control gate of said memory transistor of each divided circuit, and writing said divided unit data to said memory-cell array by applying programming pulses in parallel to the control gate of the memory transistor in a predetermined bit unit with ranging over the plurality of divided circuits.

6. A memory system according to claim 5, wherein said control circuit carries out the programming pulse application in parallel carries out the verification in the same bit unit continuously.

7. A memory system according to claim 5, wherein the charge accumulating means of said memory cell comprises an insulating film that includes a nitride film.

8. A memory system according to claim 5, wherein said memory cell includes a first memory transistor, a second memory transistor and a selection transistor formed to have a common channel formation region between said first memory transistor and said second memory transistor, and said charge accumulating means of both said memory transistor and said second memory transistor is included in the insulating film that includes the nitride film, and the first memory transistor of one memory cell and the second memory transistor of a memory cell adjacent to said one memory cell commonly have an insulation film as the control gate and the charge accumulating means.

9. A programming method for a memory system having a memory-cell array in which a plurality of memory cells, each including at least one memory transistor having a control gate controlling a charge accumulating means and a charge quantity accumulated in said charge accumulating means, and at least one selection transistor having a shared channel formation region and said memory transistor are arranged, and in which a plurality of memory cells arranged in the direction of a word line are connected in a cascade connection, and in which a programming is completed with a page as a unit, comprising the steps of:

successively holding programming data that forms a page in a division unit where the program data is divided into a plurality of division units;

successively reading the held divided unit data;

electrically dividing said memory-cell array in every interval of a plurality of memory cells corresponding to said divided unit in the direction of the word line by driving the control gate of said memory transistor; and successively writing said divided unit data to said memory-cell array by carrying out parallel programming pulse application to the control gate of the memory transistor in a predetermined bit unit.

10. A programming method of the memory system according to claim 9, wherein writing of the divided unit data is executed in such a way as to carry out the programming pulse application in parallel and to carry out the verification of the same bit unit continuously.

11. A programming method for a memory system having a plurality of divided circuits, each including a memory-cell array in which a plurality of memory cells, each including at least one memory transistor having a control gate controlling a charge accumulating means and a charge quantity accumulated in said charge accumulating means, and at least one selection transistor having a shared channel formation region and said memory transistor are arranged, and in which a plurality of memory cells arranged in the direction of a word line are connected in a cascade connection, in which a programming is completed with a page as a unit, comprising the steps of:

successively holding programming data that forms a page in a division unit, where the program data are divided into a plurality of division units;

forming said page in such a way as to range over a plurality of divided circuits;

successively reading the held divided unit data;

electrically dividing said memory-cell array in every interval of a plurality of memory cells corresponding to said divided unit in the direction of the word line by driving the control gate of said memory transistor of each said divided circuit; and successively writing said divided unit data to said memory-cell array by carrying out parallel programming pulse application to the control gate of the memory transistor in a predetermined bit unit ranging over a plurality of divided circuits.

12. The programming method of the memory system according to claim 11, wherein writing of the divided unit data is executed in such a way as to carry out programming pulse application in parallel and to carry out the verification of the same bit unit continuously.

* * * * *